(12) United States Patent
Harbers

(10) Patent No.: US 9,585,224 B2
(45) Date of Patent: Feb. 28, 2017

(54) COLOR TUNING OF A MULTI-COLOR LED BASED ILLUMINATION DEVICE

(71) Applicant: Xicato, Inc., San Jose, CA (US)

(72) Inventor: Gerard Harbers, Sunnyvale, CA (US)

(73) Assignee: Xicato, Inc., San Jose, CA (US)

( * ) Notice: Subject to any disclaimer, the term of this patent is extended or adjusted under 35 U.S.C. 154(b) by 0 days.

(21) Appl. No.: 15/240,936

(22) Filed: Aug. 18, 2016

(65) Prior Publication Data

US 2016/0360591 A1    Dec. 8, 2016

Related U.S. Application Data

(63) Continuation of application No. 14/522,342, filed on Oct. 23, 2014, now Pat. No. 9,426,863, which is a (Continued)

(51) Int. Cl.
*H01J 17/49* (2012.01)
*F21K 99/00* (2016.01)
(Continued)

(52) U.S. Cl.
CPC ......... *H05B 33/10* (2013.01); *H05B 33/0857* (2013.01); *F21K 9/64* (2016.08); *F21K 9/90* (2013.01)

(58) Field of Classification Search
CPC ... H05B 33/10; F21K 9/00; F21K 9/56; F21K 9/90
See application file for complete search history.

(56) References Cited

U.S. PATENT DOCUMENTS 5,959,316 A    9/1999 Lowery
6,351,069 B1   2/2002 Lowery et al.
(Continued)

FOREIGN PATENT DOCUMENTS

EP    1 657 757 A2    5/2006
TW    201000600 A    1/2010
(Continued)

OTHER PUBLICATIONS

International Search Report and Written Opinion mailed on May 27, 2014 for International Application No. PCT/US2014/010104 filed on Jan. 2, 2014, 15 pages.
(Continued)

*Primary Examiner* — Joseph L Williams
(74) *Attorney, Agent, or Firm* — Silicon Valley Patent Group LLP

(57) ABSTRACT

Multiple colors of light emitted by an assembled light emitting diode (LED) based illumination device is automatically tuned to within a predefined tolerance of multiple target color points by modifying portions of wavelength converting materials associated with each color. A first color of light emitted from the assembled LED based illumination device in response to a first current is measured and a second color of light emitted from the assembled LED based illumination device in response to a second current is measured. A material modification plan to modify wavelength converting materials is determined based at least in part on the measured colors of light and desired colors of light to be emitted. The wavelength converting materials may be selectively modified in accordance with the material modification plan so that the assembled LED based illumination device emits colors of light that are within a predetermined tolerance of target color points.

20 Claims, 19 Drawing Sheets

Related U.S. Application Data continuation of application No. 14/145,672, filed on Dec. 31, 2013, now Pat. No. 8,870,617.

(60) Provisional application No. 61/748,682, filed on Jan. 3, 2013.

(51) Int. Cl.
*H05B 33/10* (2006.01)
*H05B 33/08* (2006.01)

(56) References Cited

U.S. PATENT DOCUMENTS

| | | |
|---|---|---|
| 6,504,301 B1 | 1/2003 | Lowery |
| 6,586,882 B1 | 7/2003 | Harbers |
| 6,600,175 B1 | 7/2003 | Baretz et al. |
| 6,680,569 B2 | 1/2004 | Mueller-Mach et al. |
| 6,812,500 B2 | 11/2004 | Reeh et al. |
| 7,126,162 B2 | 10/2006 | Reeh et al. |
| 7,250,715 B2 | 7/2007 | Mueller et al. |
| 7,462,502 B2 | 12/2008 | Paolini et al. |
| 7,479,662 B2 | 1/2009 | Soules et al. |
| 7,564,180 B2 | 7/2009 | Brandes |
| 7,614,759 B2 | 11/2009 | Negley |
| 7,629,621 B2 | 12/2009 | Reeh et al. |
| 8,104,908 B2 | 1/2012 | Harbers et al. |
| 8,408,726 B2 | 4/2013 | Harbers et al. |
| 8,835,963 B2 | 9/2014 | Haase et al. |
| 8,845,380 B2 | 9/2014 | Harbers |
| 8,870,617 B2 | 10/2014 | Harbers |
| 8,899,767 B2 | 12/2014 | Harbers et al. |
| 8,998,452 B2 | 4/2015 | Parker et al. |
| 2007/0081336 A1 | 4/2007 | Bierhuizen et al. |
| 2009/0101930 A1 | 4/2009 | Li |
| 2009/0117672 A1 | 5/2009 | Caruso et al. |
| 2009/0261358 A1 | 10/2009 | Chitnis et al. |
| 2010/0127282 A1 | 5/2010 | Harbers et al. |
| 2010/0127289 A1 | 5/2010 | Helbing et al. |
| 2010/0207521 A1 | 8/2010 | Tamaki et al. |
| 2010/0327306 A1 | 12/2010 | Van Der Burgt et al. |
| 2011/0070669 A1 | 3/2011 | Hiller et al. |
| 2011/0216522 A1 | 9/2011 | Harbers et al. |
| 2012/0099290 A1 | 4/2012 | Harbers et al. |
| 2012/0280256 A1 | 11/2012 | Negley |
| 2012/0300452 A1 | 11/2012 | Harbers et al. |
| 2013/0241393 A1 | 9/2013 | Hayashida |
| 2013/0323862 A1 | 12/2013 | Nonomura |
| 2013/0343034 A1 | 12/2013 | Harbers et al. |
| 2014/0111985 A1 | 4/2014 | Harbers et al. |
| 2014/0159093 A1 | 6/2014 | Kraeuter |
| 2015/0118933 A1 | 4/2015 | Harbers |

FOREIGN PATENT DOCUMENTS

| | | |
|---|---|---|
| TW | 201208110 A | 2/2012 |
| TW | 201243239 A | 11/2012 |
| TW | 201248936 A | 12/2012 |
| TW | 201251130 A | 12/2012 |
| WO | WO 2012/024598 A2 | 2/2012 |
| WO | WO 2012/164930 A1 | 12/2012 |
| WO | WO 2013/032692 A1 | 3/2013 |

OTHER PUBLICATIONS

Notice of Allowance mailed on Jun. 6, 2014 for U.S. Appl. No. 14/145,672, filed Dec. 31, 2013 by Xicato, Inc., 11 pages.

Miscellaneous Communication mailed on Jul. 30, 2014 for U.S. Appl. No. 14/145,672, filed Dec. 31, 2013 by Xicato, Inc., 2 pages.

Miscellaneous Communication mailed on Sep. 24, 2014 for U.S. Appl. No. 14/145,672, filed Dec. 31, 2013 by Xicato, Inc., 2 pages.

COLOR TUNING OF A MULTI-COLOR LED BASED ILLUMINATION DEVICE

CROSS REFERENCE TO RELATED APPLICATIONS

This application is a continuation of and claims priority to U.S. application Ser. No. 14/522,342, filed Oct. 23, 2014, which is a continuation of and claims priority to U.S. application Ser. No. 14/145,672, filed Dec. 31, 2013, which has been granted as U.S. Pat. No. 8,870,617, issued on Oct. 28, 2014, which claims priority under 35 USC §119 to U.S. Provisional Application No. 61/748,682, filed Jan. 3, 2013, all of which are incorporated by reference herein in their entireties.

TECHNICAL FIELD

The described embodiments relate to illumination devices that include Light Emitting Diodes (LEDs).

BACKGROUND

The use of light emitting diodes in general lighting is still limited due to limitations in light output level or flux generated by the illumination devices. Illumination devices that use LEDs also typically suffer from poor color quality characterized by color point instability. The color point instability varies over time as well as from part to part. Poor color quality is also characterized by poor color rendering, which is due to the spectrum produced by the LED light sources having bands with no or little power. Further, illumination devices that use LEDs typically have spatial and/or angular variations in the color. Additionally, illumination devices that use LEDs are expensive due to, among other things, the necessity of required color control electronics and/or sensors to maintain the color point of the light source or using only a small selection of produced LEDs that meet the color and/or flux requirements for the application.

Consequently, improvements to illumination device that uses light emitting diodes as the light source are desired.

SUMMARY

Multiple colors of light emitted by an assembled light emitting diode (LED) based illumination device is automatically tuned to within a predefined tolerance of multiple target color points by modifying portions of wavelength converting materials associated with each color. A first color of light emitted from the assembled LED based illumination device in response to a first current is measured and a second color of light emitted from the assembled LED based illumination device in response to a second current is measured. A material modification plan to modify wavelength converting materials is determined based at least in part on the measured colors of light and desired colors of light to be emitted. The material modification plan may further include the location of the wavelength converting materials to be modified, which may be based on, e.g., the output beam intensity distribution, color conversion efficiency, a color uniformity, and a temperature distribution over a light emitting surface. The wavelength converting materials may be selectively modified in accordance with the material modification plan so that the assembled LED based illumination device emits colors of light that are within a predetermined tolerance of target color points. For example, the wavelength converting materials may be selectively modified by removing amounts the wavelength converting materials by laser ablation, mechanical scribing, ion etching, chemical etching, electrical discharge machining, plasma etching, and chemical mechanical polishing or adding amounts of wavelength converting materials by jet dispensing, spray coating, screen printing, and blade coating.

Further details and embodiments and techniques are described in the detailed description below. This summary does not define the invention. The invention is defined by the claims.

DETAILED DESCRIPTION

Reference will now be made in detail to background examples and some embodiments of the invention, examples of which are illustrated in the accompanying drawings.

Figure 1:
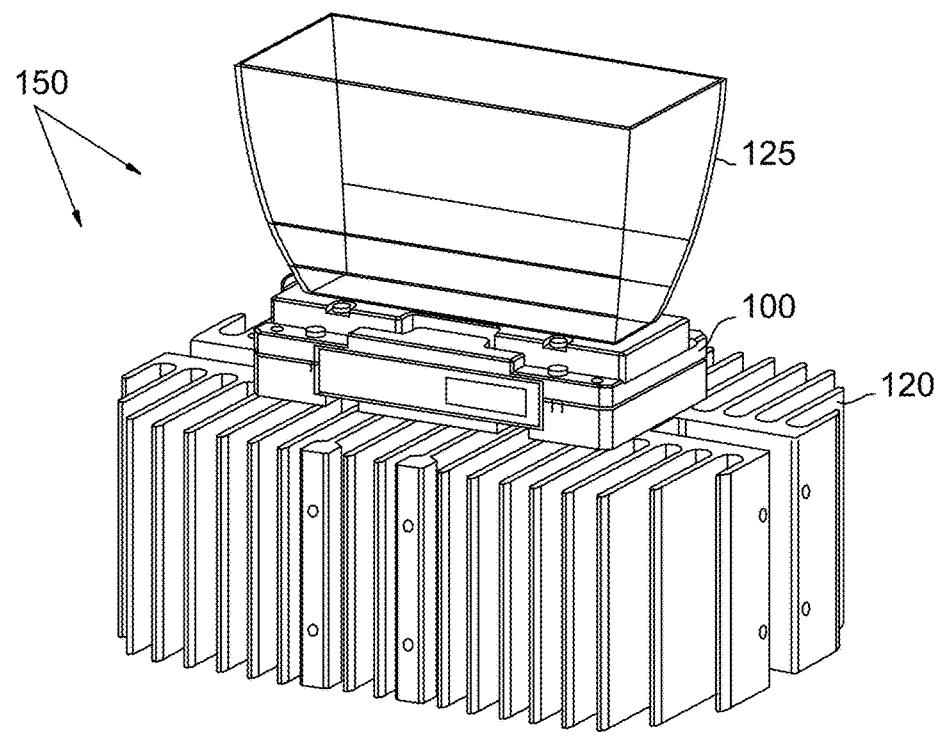
FIGS. 1, 2, and 3 illustrate three exemplary luminaires, including an illumination device, reflector, and light fixture.
Figure 2:
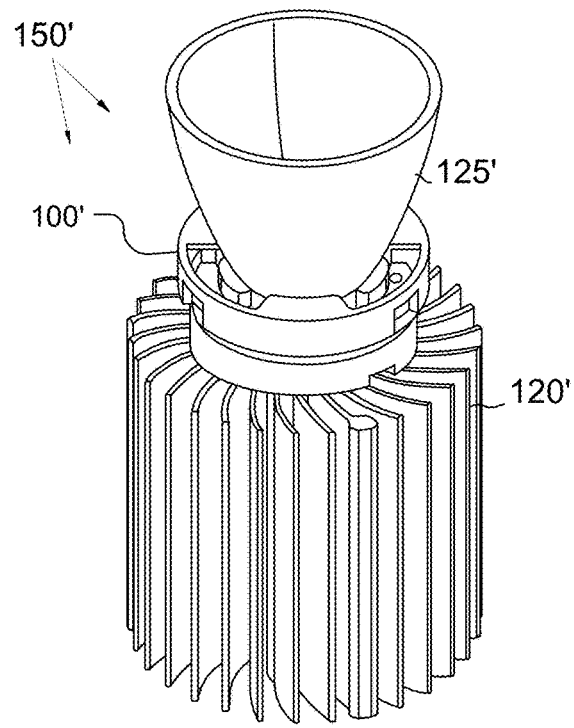
Figure 3:
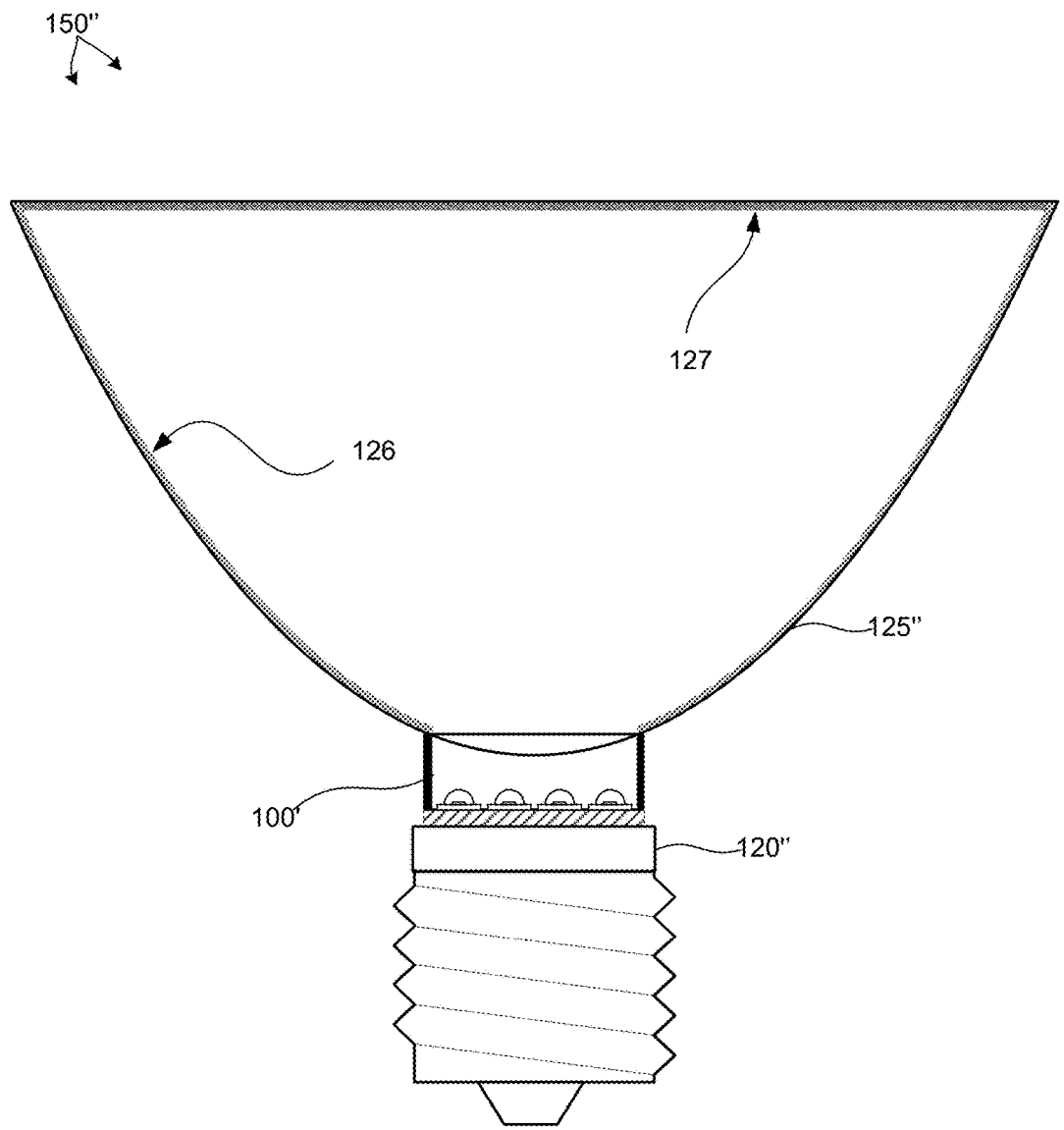

FIGS. 1, 2, and 3 illustrate three exemplary luminaires, labeled 150, 150', and 150'', which are sometimes collectively referred to as luminaire 150. The luminaire illustrated in FIG. 1 includes an LED based illumination device 100 with a rectangular form factor. The luminaire illustrated in FIG. 2 includes an LED based illumination device 100' with a circular form factor. The luminaire illustrated in FIG. 3 includes an LED based illumination device 100' integrated into a retrofit lamp device. These examples are for illustrative purposes. Examples of LED based illumination devices of general polygonal and elliptical shapes may also be contemplated, and in general, LED based illumination devices 100 and 100' may be collectively referred to as LED based illumination device 100. As illustrated in FIG. 1, luminaire 150 includes illumination device 100, reflector 125, and light fixture 120. FIG. 2 shows luminaire 150' with illumination device 100', reflector 125', and light fixture 120' and FIG. 3 shows luminaire 150'' with illumination device 100', reflector 125'', and light fixture 120''. Reflectors 125, 125', and 125'' are sometimes collectively referred to herein as reflector 125, and light fixtures 120, 120', and 120'' are sometimes collectively referred to herein as light fixture 120. As depicted, light fixture 120 includes a heat sink capability, and therefore may be sometimes referred to as heat sink 120. However, light fixture 120 may include other structural and decorative elements (not shown). Reflector 125 is mounted to illumination device 100 to collimate or deflect light emitted from illumination device 100. The reflector 125 may be made from a thermally conductive material, such as a material that includes aluminum or copper and may be thermally coupled to illumination device 100. Heat flows by conduction through illumination device 100 and the thermally conductive reflector 125. Heat also flows via thermal convection over the reflector 125. Reflector 125 may be a compound parabolic concentrator, where the concentrator is constructed of or coated with a highly reflecting material. Optical elements, such as a diffuser or reflector 125 may be removably coupled to illumination device 100, e.g., by means of threads, a clamp, a twist-lock mechanism, or other appropriate arrangement. As illustrated in FIG. 3, a reflector 125 may include sidewalls 126 and a window 127 that are optionally coated, e.g., with a wavelength converting material, diffusing material or any other desired material.

As depicted in FIGS. 1, 2, and 3, illumination device 100 is mounted to heat sink 120. Heat sink 120 may be made from a thermally conductive material, such as a material that includes aluminum or copper and may be thermally coupled to illumination device 100. Heat flows by conduction through illumination device 100 and the thermally conductive heat sink 120. Heat also flows via thermal convection over heat sink 120. Illumination device 100 may be attached to heat sink 120 by way of screw threads to clamp the illumination device 100 to the heat sink 120. To facilitate easy removal and replacement of illumination device 100, illumination device 100 may be removably coupled to heat sink 120, e.g., by means of a clamp mechanism, a twist-lock mechanism, or other appropriate arrangement. Illumination device 100 includes at least one thermally conductive surface that is thermally coupled to heat sink 120, e.g., directly or using thermal grease, thermal tape, thermal pads, or thermal epoxy. For adequate cooling of the LEDs, a thermal contact area of at least 50 square millimeters, but preferably 100 square millimeters should be used per one watt of electrical energy flow into the LEDs on the board. For example, in the case when 20 LEDs are used, a 1000 to 2000 square millimeter heat sink contact area should be used. Using a larger heat sink 120 may permit the LEDs 102 to be driven at higher power, and also allows for different heat sink designs. For example, some designs may exhibit a cooling capacity that is less dependent on the orientation of the heat sink. In addition, fans or other solutions for forced cooling may be used to remove the heat from the device. The bottom heat sink may include an aperture so that electrical connections can be made to the illumination device 100.

Figure 4:
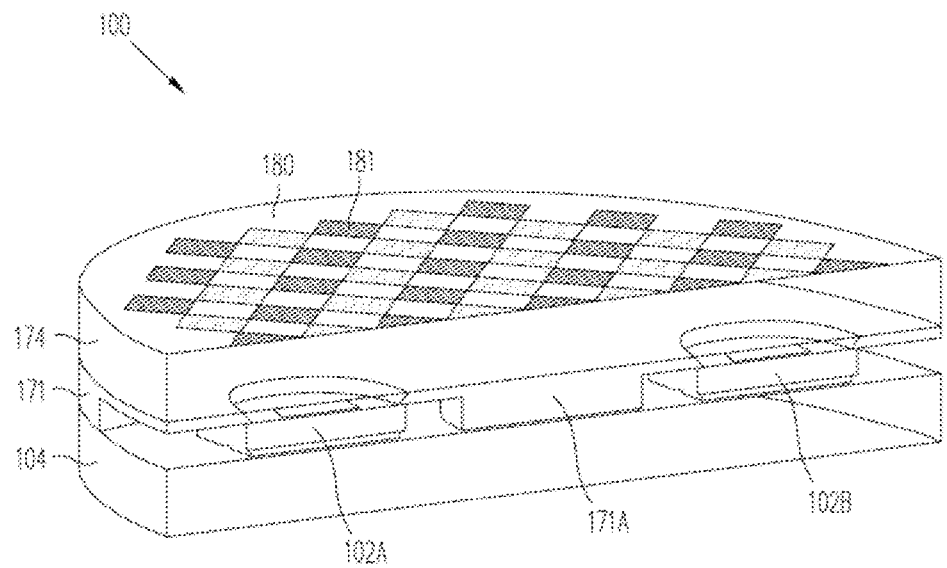
FIG. 4 illustrates a perspective cut-away view of components in an embodiment of an LED based illumination device including a base reflector structure that physically couples a transmissive plate and an LED mounting board.
Figure 5:
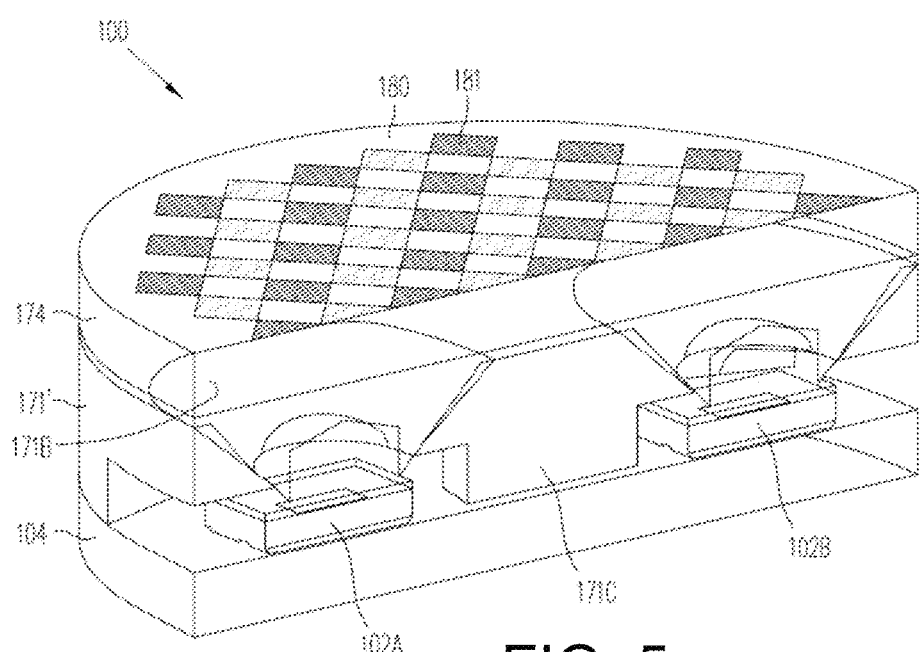
FIG. 5 illustrates a perspective cut-away view of components in another embodiment of an LED based illumination device including a base reflector structure that physically couples a transmissive plate and an LED mounting board.
Figure 6:
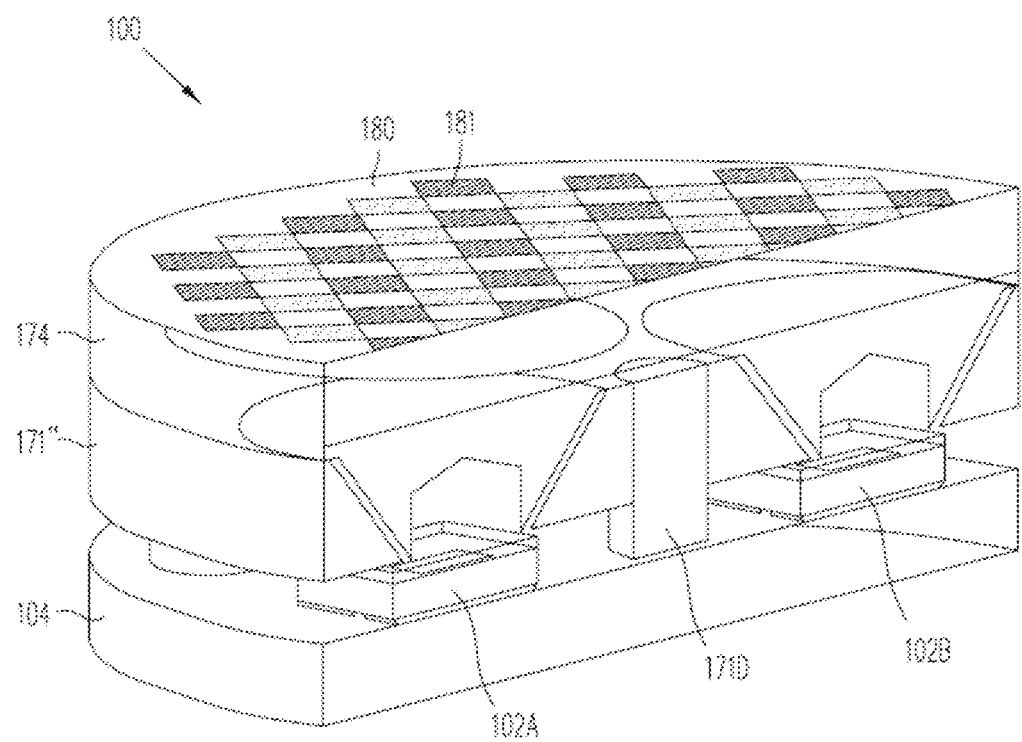
FIG. 6 illustrates a perspective cut-away view of components in another embodiment of an LED based illumination device including a base reflector structure that physically couples a transmissive plate and an LED mounting board.

FIGS. 4, 5, and 6 illustrate perspective cut-away views of components of various embodiments of LED based illumination device 100. It should be understood that as defined herein an LED based illumination device is not an LED, but is an LED light source or fixture or component part of an LED light source or fixture. For example, an LED based illumination device may be an LED based replacement lamp such as depicted in FIG. 3. LED based illumination device 100 includes one or more LED die or packaged LEDs and a mounting board to which LED die or packaged LEDs are attached. In one embodiment, the LEDs 102A and 102B, sometimes referred to herein as LEDs 102 are packaged LEDs, such as the Luxeon Rebel manufactured by Philips Lumileds Lighting. Other types of packaged LEDs may also be used, such as those manufactured by OSRAM (Oslon package), Luminus Devices (USA), Cree (USA), Nichia (Japan), or Tridonic (Austria). As defined herein, a packaged LED is an assembly of one or more LED die that contains electrical connections, such as wire bond connections or stud bumps, and possibly includes an optical element and thermal, mechanical, and electrical interfaces. The LED chip typically has a size about 1 mm by 1 mm by 0.5 mm, but these dimensions may vary. In some embodiments, the LEDs 102 may include multiple chips. The multiple chips can emit light of similar or different colors, e.g., red, green, and blue. LEDs 102 are mounted to mounting board 104. The light emitted from LEDs 102 is directed to transmissive plate 174. A thermally conductive base reflector structure 171 promotes heat dissipation from the transmissive plate 174 to the mounting board 104, upon which the LEDs 102 are mounted.

FIG. 5 illustrates LED based illumination device 100 with the base reflector structure 171'. As illustrated, the base reflector structure 171' includes deep reflector surfaces 171B that direct light emitted from LEDs 102 to transmissive plate 174. In addition, base reflector structure 171' includes a centrally located feature 171C that thermally connects transmissive plate 174 and mounting board 104. As illustrated, base reflector structure 171' is constructed from one part to minimize manufacturing complexity.

As illustrated in FIG. 6, base reflector structure 171" includes a thermally conductive insert 171D that thermally couples transmissive plate 174 and mounting board 104. In this manner, base reflector structure may be constructed from a low cost material (e.g., plastic) and the thermally conductive insert 171D may be constructed from a material optimized for thermal conductivity (e.g., aluminum or copper).

As depicted in FIGS. 4-6, base reflector structure 171 is in physical contact with transmissive plate 174 and mounting board 104. However, in some other embodiments, base reflector structure 171 may be in physical contact with transmissive plate 174 and heat sink 120. In this manner, a more direct thermal path between transmissive plate 174 and heat sink 120 is realized. In one example, elements of base reflector structure 171 may be configured to pass through voids in LED board 104 to directly couple transmissive plate 174 to heat sink 120.

Base reflector structure 171 may have a high thermal conductivity to minimize thermal resistance. By way of example, base reflector structure 171 may be made with a highly thermally conductive material, such as an aluminum based material that is processed to make the material highly reflective and durable. By way of example, a material referred to as Miro®, manufactured by Alanod, a German company, may be used.

Figure 7:
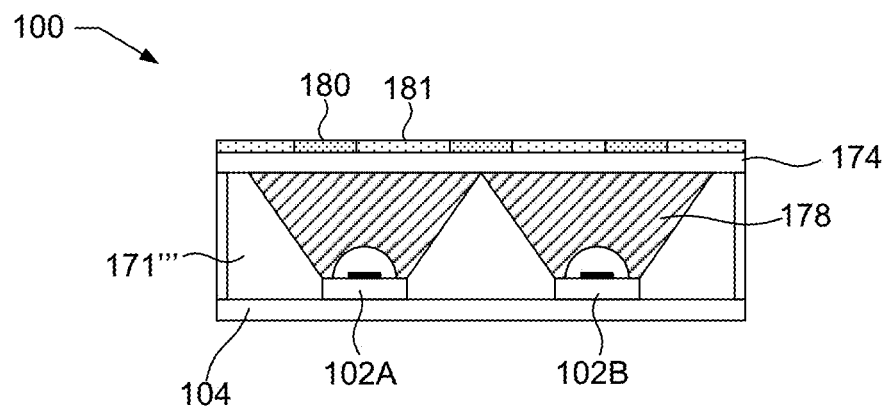
FIG. 7 illustrates a side view of components in another embodiment of an LED based illumination device with a total internal reflection (TIR) lens structure to direct light emitted from LEDs to a transmissive plate.

FIG. 7 is illustrative of another configuration of LED based illumination device 100, which is similar to that shown in FIGS. 4-6, like designated elements being the same. As illustrated in FIG. 7, LED based illumination device 100 may include a total internal reflection (TIR) lens structure 178 to direct light emitted from LEDs 102 to transmissive plate 174.

Figure 8:
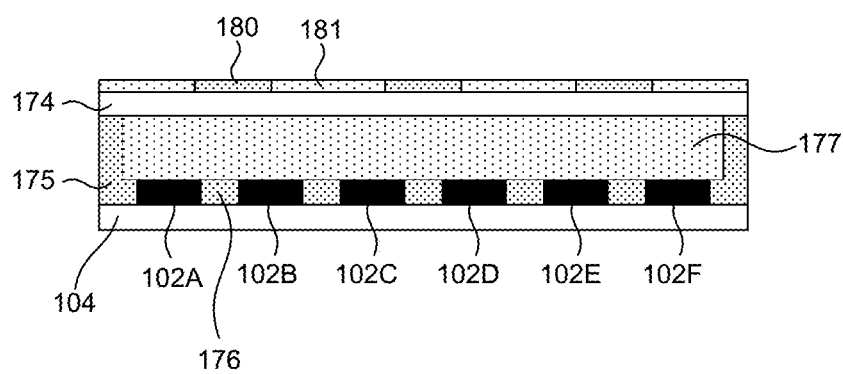
FIG. 8 illustrates a side view of components in another embodiment of an LED based illumination device with a dam of reflective material surrounding the LEDs and supporting a transmissive plate.

FIG. 8 is illustrative of another configuration of LED based illumination device 100, which is similar to that shown in FIGS. 4-6, like designated elements being the same. As illustrated in FIG. 8, LED based illumination device 100 includes a number of LEDs 102A-F, collectively referred to as LEDs 102, arranged in a chip on board (COB) configuration. LED based illumination device 100 also includes a base reflector structure including a reflective material 176 disposed in the spaces between each LED and a dam of reflective material 175 that surrounds the LEDs 102 and supports transmissive plate 174. In some examples, reflective materials 175 and 176 are a white, reflective silicone-based material. In the embodiment depicted in FIG. 8, the space between LEDs 102 and transmissive plate 174 is filled with an encapsulating optically translucent material 177 (e.g., silicone) to promote light extraction from LEDs 102 and to separate LEDs 102 from the environment.

Figure 9:
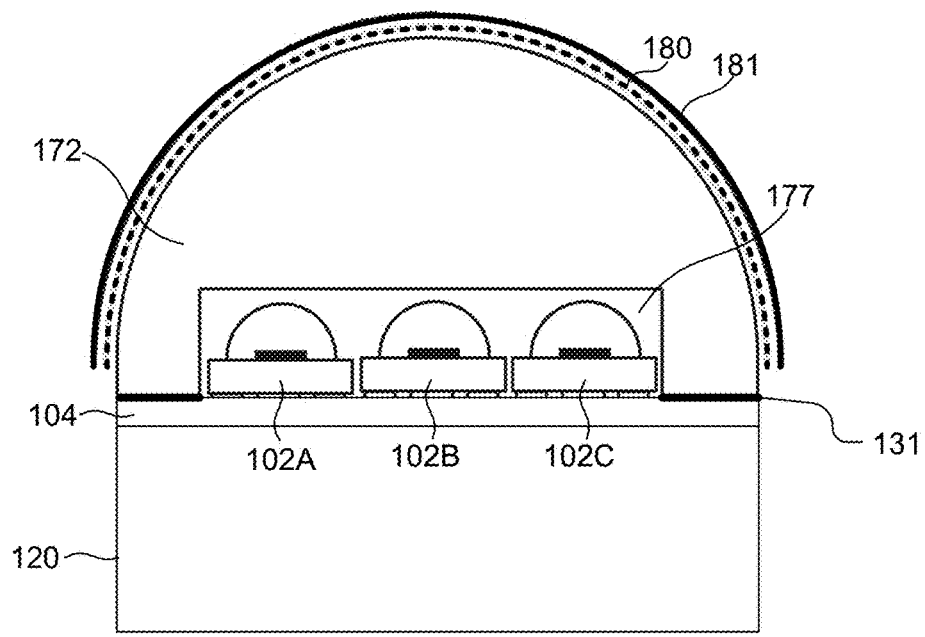
FIG. 9 illustrates a side view of components in another embodiment of an LED based illumination device with a shaped lens disposed over the LEDs and thermally coupled to the LED mounting board.

FIG. 9 is illustrative of another configuration of LED based illumination device 100, which is similar to that shown in FIGS. 4-6, like designated elements being the same. As illustrated, LED based illumination device 100 includes a shaped lens 172 disposed over LEDs 102A, 102B, and 102C, collectively referred to as LEDs 102. As illustrated, shaped lens 172 includes at least one wavelength converting material at the light emitting surface of shaped lens 172. Shaped lens 172 is directly coupled to mounting board 104 to promote heat flow from shaped lens 172 to mounting board 104. In this manner, heat generated by color conversion on surfaces of shaped lens 172 is efficiently transferred to mounting board 104 at thermal interface surface 131 and removed from LED based illumination device 100 via heat sink 120. In some other embodiments, shaped lens 172 is directly coupled to heat sink 120.

The optical surfaces of base reflector structure 171 may be treated to achieve high reflectivity. For example the optical surface of base reflector structure 171 may be polished, or covered by one or more reflective coatings (e.g., reflective materials such as Vikuiti™ ESR, as sold by 3M (USA), Lumirror™ E60L manufactured by Toray (Japan), or microcrystalline polyethylene terephthalate (MCPET) such as that manufactured by Furukawa Electric Co. Ltd. (Japan), a polytetrafluoroethylene PTFE material such as that manufactured by W.L. Gore (USA) and Berghof (Germany)). Also, highly diffuse reflective coatings can be applied to optical surfaces of base reflector structure 171. Such coatings may include titanium dioxide (TiO2), zinc oxide (ZnO), and barium sulfate (BaSO4) particles, or a combination of these materials.

In some embodiments, base reflector structure 171 may be constructed from or include a reflective, ceramic material, such as ceramic material produced by CerFlex International (The Netherlands). In some embodiments, portions of any of the optical surfaces of base reflector structure 171 may be coated with a wavelength converting material.

LEDs 102 can emit different or the same colors, either by direct emission or by phosphor conversion, e.g., where phosphor layers are applied to the LEDs as part of the LED package. The illumination device 100 may use any combination of colored LEDs 102, such as red, green, blue, amber, or cyan, or the LEDs 102 may all produce the same color light. Some or all of the LEDs 102 may produce white light. In addition, the LEDs 102 may emit polarized light or non-polarized light and LED based illumination device 100 may use any combination of polarized or non-polarized LEDs. In some embodiments, LEDs 102 emit either blue or UV light because of the efficiency of LEDs emitting in these wavelength ranges. The light emitted from the illumination device 100 has a desired color when LEDs 102 are used in combination with wavelength converting materials on transmissive plate 174 or shaped lens 172, for example. By tuning the chemical and/or physical (such as thickness and concentration) properties of the wavelength converting materials and the geometric properties of the coatings on the surfaces of transmissive plate 174 or shaped lens 172, specific color properties of light output by LED based illumination device 100 may be specified, e.g., color point, color temperature, and color rendering index (CRI).

For purposes of this patent document, a wavelength converting material is any single chemical compound or mixture of different chemical compounds that performs a color conversion function, e.g., absorbs an amount of light of one peak wavelength, and in response, emits an amount of light at another peak wavelength.

In some examples, a wavelength converting material is a phosphor or mixture of different phosphors. By way of example, phosphors may be chosen from the set denoted by the following chemical formulas: Y3Al5O12:Ce, (also known as YAG:Ce, or simply YAG) (Y,Gd)3Al5O12:Ce, CaS:Eu, SrS:Eu, SrGa2S4:Eu, Ca3(Sc,Mg)2Si3O12:Ce, Ca3Sc2Si3O12:Ce, Ca3Sc2O4:Ce, Ba3Si6O12N2:Eu, (Sr,Ca)AlSiN3:Eu, CaAlSiN3:Eu, CaAlSi(ON)3:Eu, Ba2SiO4:Eu, Sr2SiO4:Eu, Ca2SiO4:Eu, CaSc2O4:Ce, CaSi2O2N2:Eu, SrSi2O2N2:Eu, BaSi2O2N2:Eu, Ca5(PO4)3Cl:Eu, Ba5(PO4)3Cl:Eu, Cs2CaP2O7, Cs2SrP2O7, Lu3Al5O12:Ce, Ca8Mg(SiO4)4Cl2:Eu, Sr8Mg(SiO4)4Cl2:Eu, La3Si6N11:Ce, Y3Ga5O12:Ce, Gd3Ga5O12:Ce, Tb3Al5O12:Ce, Tb3Ga5O12:Ce, and Lu3Ga5O12:Ce.

In one example, the adjustment of color point of the illumination device may be accomplished by adding or removing wavelength converting material from transmissive plate 174 or shaped lens 172, which similarly may be coated or impregnated with one or more wavelength converting materials. In one embodiment a red emitting phosphor 181 such as an alkaline earth oxy silicon nitride covers a portion of transmissive plate 174 or shaped lens 172, and a yellow emitting phosphor 180 such as YAG covers another portion of transmissive plate 174 or shaped lens 172, as illustrated in FIGS. 4-9.

In some embodiments, the phosphors are mixed in a suitable solvent medium with a binder and, optionally, a surfactant and a plasticizer. The resulting mixture is deposited by any of spraying, screen printing, blade coating, jetting, or other suitable means. By choosing the shape and height of the transmissive plate 174 or shaped lens 172, and selecting which portions of transmissive plate 174 or shaped lens 172 will be covered with a particular phosphor or not, and by optimization of the layer thickness and concentration of a phosphor layer on the surfaces, the color point of the light emitted from the device can be tuned as desired.

In one example, a single type of wavelength converting material may be patterned on a portion of transmissive plate 174 or shaped lens 172. By way of example, a red emitting phosphor 181 may be patterned on different areas of the transmissive plate 174 or shaped lens 172 and a yellow emitting phosphor 180 may be patterned on other areas of transmissive plate 174 or shaped lens 172. In some examples, the areas may be physically separated from one another. In some other examples, the areas may be adjacent to one another. The coverage and/or concentrations of the phosphors may be varied to produce different color temperatures. It should be understood that the coverage area of the red and/or the concentrations of the red and yellow phosphors will need to vary to produce the desired color temperatures if the light produced by the LEDs 102 varies. The color performance of the LEDs 102, red phosphor and the yellow phosphor may be measured and modified by any of adding or removing phosphor material based on performance so that the final assembled product produces the desired color temperature.

Transmissive plate 174 and shaped lens 172 may be constructed from a suitable optically transmissive material (e.g., sapphire, alumina, crown glass, polycarbonate, and other plastics).

Figure 10:
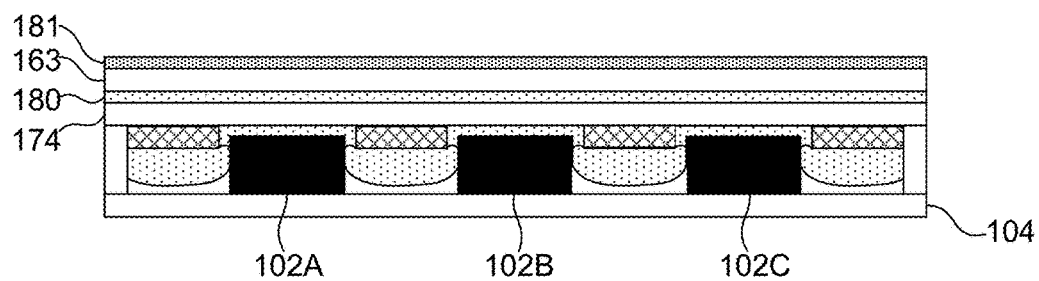
FIG. 10 illustrates a side view of components in another embodiment of an LED based illumination device with multiple transmissive plates.

In some embodiments, multiple, stacked transmissive layers are employed. Each transmissive layer includes different wavelength converting materials. For example, as illustrated in FIG. 10, transmissive layer 174 includes wavelength converting material 180 over the surface area of transmissive layer 174. In addition, a second transmissive layer 163 is placed over and in contact with transmissive layer 174. Transmissive layer 163 includes wavelength converting material 181. Although, as illustrated in FIG. 10, transmissive layer 163 is placed over and in contact with transmissive layer 174, a space may be maintained between the two elements. This may be desirable to promote cooling of the transmissive layers. For example, airflow may by introduced through the space to cool the transmissive layers.

Figure 11:
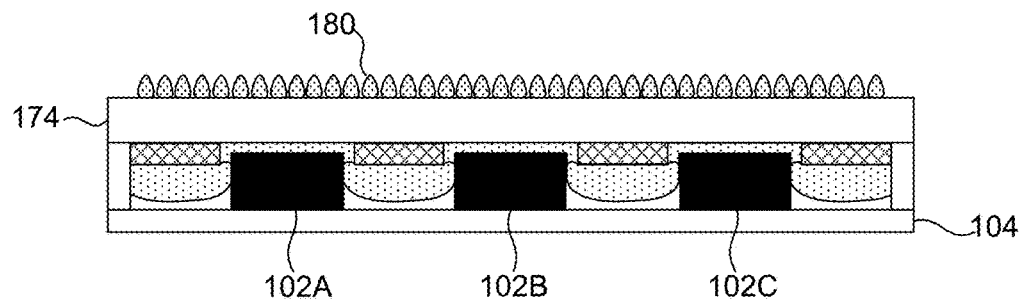
FIG. 11 illustrates a side view of components in another embodiment of an LED based illumination device with droplets of a wavelength converting material uniformly applied to the surface of transmissive layer.

In some embodiments, any of the wavelength converting materials may be applied as a pattern (e.g., stripes, dots, blocks, droplets, etc.). For example, as illustrated in FIG. 11, droplets of wavelength converting material 180 are uniformly applied to the surface of transmissive layer 174. Shaped droplets may improve extraction efficiency by increasing the amount of surface area of the droplet.

Figure 12:
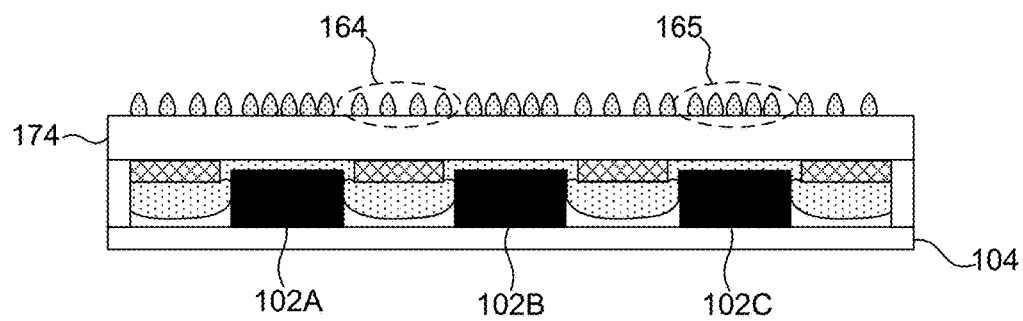
FIG. 12 illustrates a side view of components in another embodiment of an LED based illumination device with droplets of a wavelength converting material applied to the surface of transmissive layer in a non-uniform pattern.

As illustrated in FIG. 12, in some embodiments, droplets of wavelength converting material 180 may be spaced on transmissive layer 174 in a non-uniform pattern. For example, a group of droplets 165 located over LED 102C is densely packed (e.g., droplets in contact with adjacent droplets), while a group of droplets 164 located over a space between LEDs 102A and 102B is loosely packed (e.g., droplets spaced apart from adjacent droplets). In this manner, the color point of light emitted from LED based illumination device 100 may be tuned by varying the packing density of droplets on transmissive layer 174.

Figure 13:
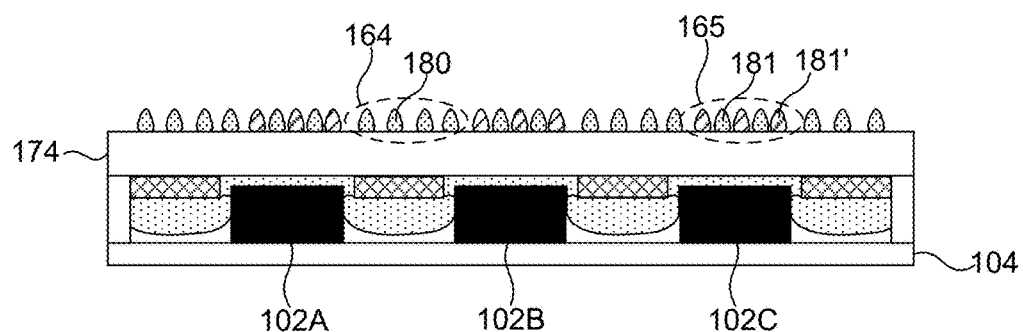
FIG. 13 illustrates a side view of components in another embodiment of an LED based illumination device with droplets of different wavelength converting materials applied to the surface of transmissive layer in a non-uniform pattern.

As illustrated in FIG. 13, in some embodiments, droplets of different wavelength converting materials may be placed in different locations of transmissive layer 174 and may also be placed in a non-uniform pattern. For example, group of droplets 164 may include wavelength converting material 180 and group of droplets 165 may include a combination of droplets including wavelength converting material 181 and wavelength converting material 181'. In this manner, combinations of different wavelength converting materials are located relative to LEDs 102 in varying densities to achieve a desired color point of light emitted from LED based illumination device 100.

In the illustrated embodiments, wavelength converting materials are located on the surface of transmissive layer 174. However, in some other embodiments, any of the wavelength converting materials may be embedded within transmissive layer 174, on the side of transmissive layer 174 facing LEDs 102, or any combination thereof.

The area between LEDs 102 and transmissive plate 174 or shaped lens 172 may be filled with a non-solid material, such as air or an inert gas, so that the LEDs 102 emit light into the non-solid material. By way of example, the cavity may be hermetically sealed and Argon gas used to fill the cavity. Alternatively, Nitrogen may be used. In other embodiments, the area between LEDs 102 and transmissive plate 174 or shaped lens 172 may be filled with a solid encapsulate material. By way of example, silicone may be used to fill the cavity. In some other embodiments, color conversion cavity 160 may be filled with a fluid to promote heat extraction from LEDs 102. In some embodiments, wavelength converting material may be included in the fluid to achieve color conversion.

Figure 14:
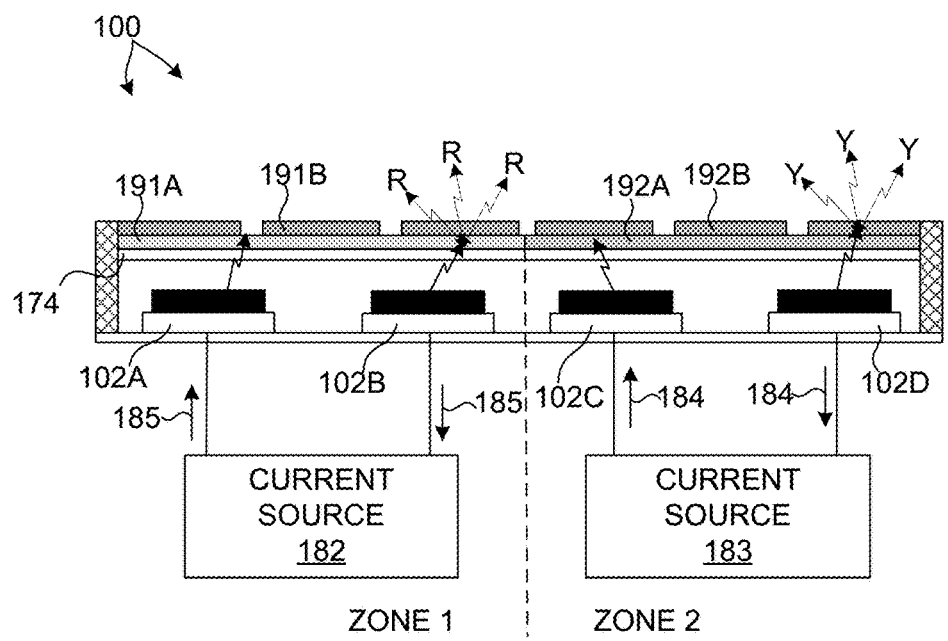
FIG. 14 illustrates a cross-sectional, side view of an LED based illumination module with separate current sources in two zones.

FIG. 14 is illustrative of a cross-sectional, side view of an LED based illumination module 100 in one embodiment. As illustrated, LED based illumination module 100 includes a plurality of LEDs 102A-102D and transmissive element 174 disposed above LEDs 102A-102D. As depicted transmissive element 174 is physically separated from the light emitting surfaces of the LEDs 102. However, in some other embodiments, transmissive element 174 is physically coupled to the light emitting surfaces of the LEDs 102 by an optically transmissive medium (e.g., silicone, optical adhesive, etc.). As depicted, transmissive element 174 is a plate of optically transmissive material (e.g., glass, sapphire, alumina, polycarbonate, and other plastics etc.). However, any other shape may be contemplated. As depicted in FIG. 14, LEDs 102 are physically separated from wavelength converting materials 191A, 191B, 192A, and 192B. By spacing the wavelength converting materials from LEDs 102, heat transfer from the LEDs 102 to the wavelength converting materials is decreased. As a result, the wavelength converting materials are maintained at a lower temperature during operation. This increases the reliability and color maintenance of the LED based illumination device 100.

Transmissive element 174 includes a first wavelength converting material 191A and a second wavelength converting material 191B disposed over portions of material 191A. Transmissive element 174 also includes a third wavelength converting material 192A and a fourth wavelength converting material 192B disposed over portions of material 192A. The wavelength converting materials 191A-B and 192A-B may be disposed on transmissive element 174 or embedded within transmissive element 174. Additional wavelength converting materials may also be included as part of transmissive element 174. For example, additional surface areas of transmissive element 174 may include additional wavelength converting materials. As depicted in FIG. 14, wavelength converting material 191A is a red emitting phosphor that is preferentially illuminated by LEDs 102A and 102B and wavelength converting material 191B is a mixture of yellow and green emitting phosphors that is also preferentially illuminated by LEDs 102A and 102B. In addition, wavelength converting material 192A is a red emitting phosphor that is preferentially illuminated by LEDs 102C and 102D and wavelength converting material 192B is a yellow emitting phosphor that is also preferentially illuminated by LEDs 102C and 102D. In some embodiments, wavelength converting material 191A and 192A are the same material. Similarly, in some embodiments, wavelength converting material 191B and 192B are the same material.

A different current source supplies current to LEDs 102 in different preferential zones. In the example depicted in FIG. 14, current source 182 supplies current 185 to LEDs 102A and 102B located in preferential zone 1. Similarly, current source 183 supplies current 184 to LEDs 102C and 102D located in preferential zone 2. By separately controlling the current supplied to LEDs located in different preferential zones, the correlated color temperatures (CCT) of combined light output by LED based illumination module may be adjusted over a broad range of CCTs. In some embodiments, the LEDs 102 of LED based illumination device emit light with a peak emission wavelength within five nanometers of each other. For example, LEDs 102A-D all emit blue light with a peak emission wavelength within five nanometers of each other. In this manner, white light emitted from LED based illumination device 100 is generated in large part by wavelength converting materials. Thus, color control is based on the arrangement of different wavelength converting materials to be preferentially illuminated by different subsets of LEDs.

Figure 15:
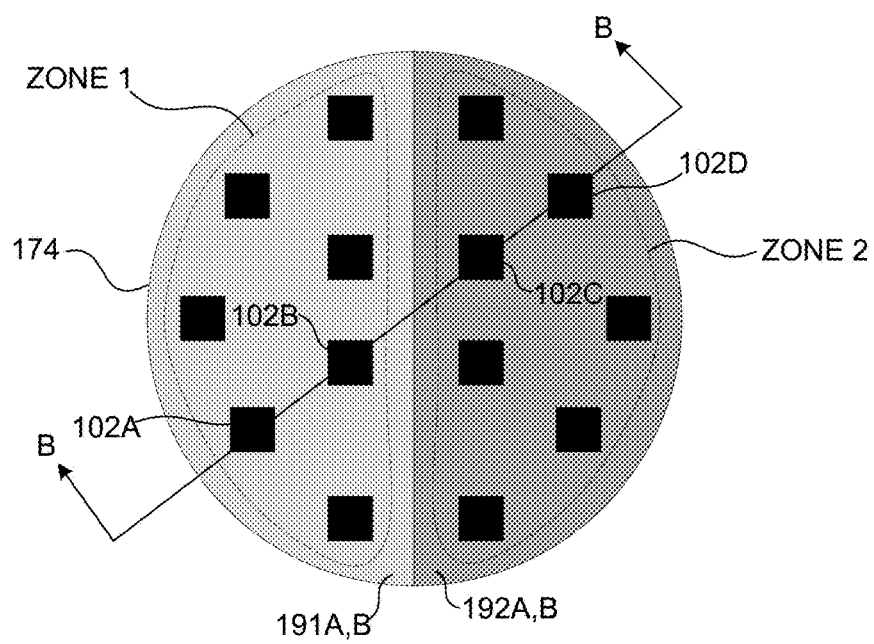
FIG. 15 illustrates a top view of the LED based illumination module from FIG. 14.

FIG. 15 illustrates a top view of the LED based illumination module 100 depicted in FIG. 14. FIG. 14 depicts a cross-sectional view of LED based illumination device 100 along section line, B, depicted in FIG. 15. As illustrated in FIG. 15, wavelength converting materials 191A and 191B cover a portion of transmissive element 174 and wavelength converting materials 192A and 192B cover another portion of transmissive element 174. LEDs in zone 1 (including LEDs 102A and 102B) preferentially illuminate wavelength converting materials 191A and 191B. Similarly, LEDs in zone 2 (including LEDs 102C and 102D) preferentially illuminate wavelength converting materials 192A and 192B. In some embodiments, more than fifty percent of the light output by LEDs in zone 1 is directed to wavelength converting materials 191A and 191B, while more than fifty percent of the light output by LEDS in zone 2 is directed to wavelength converting materials 192A and 192B. In some other embodiments, more than seventy five percent of the light output by LEDs in zone 1 is directed to wavelength converting materials 191A and 191B, while more than seventy five percent of the light output by LEDS in zone 2 is directed to wavelength converting materials 192A and 192B. In some other embodiments, more than ninety percent of the light output by LEDs in zone 1 is directed to wavelength converting materials 191A and 191B, while more than ninety percent of the light output by LEDS in zone 2 is directed to wavelength converting materials 192A and 192B.

In one embodiment, light emitted from LEDs located in preferential zone 1 is directed to wavelength converting materials 191A and 191B. When current source 182 supplies current 185 to LEDs in preferential zone 1, the light output is a light with a correlated color temperature (CCT) less than 7,500 Kelvin. In some other examples, the light output has a CCT less than 5,000 Kelvin. In some embodiments, the light output has a color point within a degree of departure Δxy of 0.010 from a target color point in the CIE 1931 xy diagram. Thus, when current is supplied to LEDs in preferential zone 1 and substantially no current is supplied to LEDs in preferential zone 2, the combined light output 141 from LED based illumination module 100 is white light that meets a specific color point target (e.g., within a degree of departure Δxy of 0.010 within 3,000 Kelvin on the Planckian locus). In some embodiments, the light output has a color point within a degree of departure Δxy of 0.004 from a target color point in the CIE 1931 xy diagram. In this manner, there is no need to tune multiple currents supplied to different LEDs of LED based illumination device 100 to achieve a white light output that meets the specified color point target.

When current source 183 supplies current 184 to LEDs in preferential zone 2, the light output has a relatively low CCT. In some examples the light output has a CCT less than 2,200 Kelvin. In some other examples, the light output has a CCT less than 2,000 Kelvin. In some other examples, the light output has a CCT less than 1,800 Kelvin. Thus, when current is supplied to LEDs in preferential zone 2 and substantially no current is supplied to LEDs in preferential zone 1, the combined light output from LED based illumination module 100 is a very warm colored light. By adjusting the current 185 supplied to LEDs located in zone 1 relative to the current 184 supplied to LEDs located in zone 2, the amount of white light relative to warm colored light may be adjusted. Thus, control of currents 184 and 185 may be used to tune the CCT of light emitted from LED based illumination module 100 from a relatively high CCT to a relatively low CCT. In some examples, control of currents 184 and 185 may be used to tune the CCT of light emitted from LED based illumination module 100 from a white light of at least 2,700 Kelvin to a warm light below 1,800 Kelvin). In some other examples, a warm light below 1,700 Kelvin is achieved.

Figure 16:
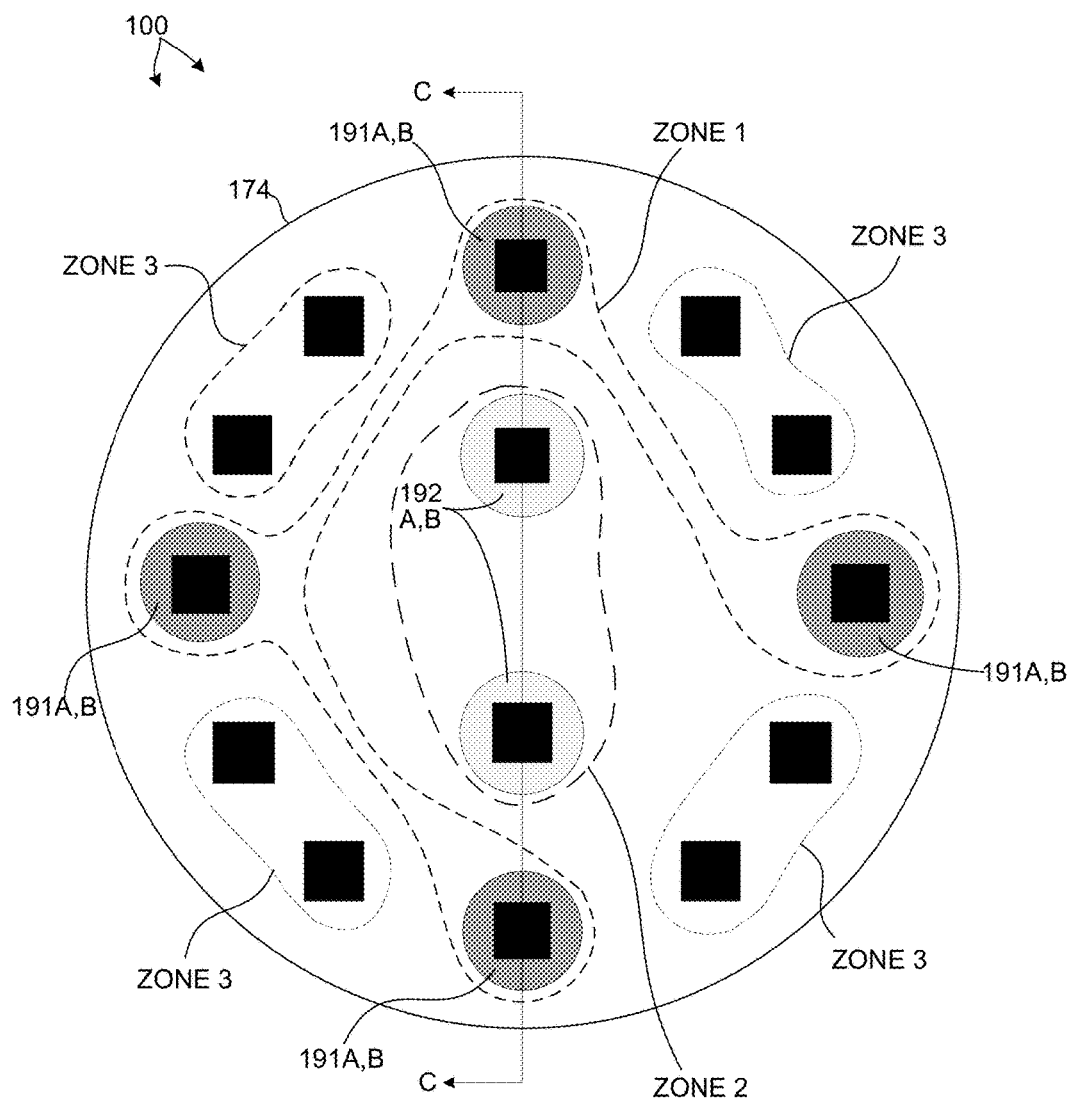
FIG. 16 illustrates a top view of an LED based illumination module 100 with a plurality of zones.
Figure 17:
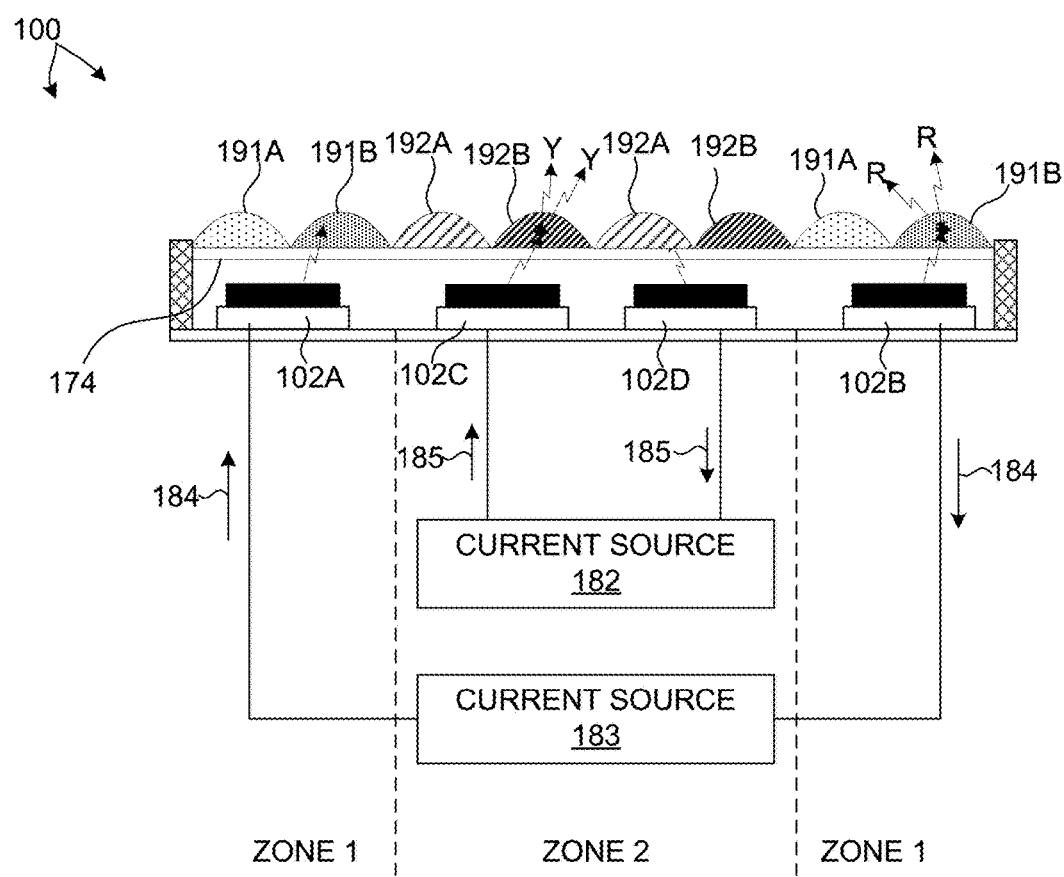
FIG. 17 depicts a cross-sectional view of the LED based illumination device of from FIG. 16.

FIG. 16 illustrates a top view of the LED based illumination module 100 in another embodiment. FIG. 17 depicts a cross-sectional view of LED based illumination device 100 along section line, C, depicted in FIG. 16. As illustrated in FIG. 17, wavelength converting materials 191A and 191B cover a portion of transmissive element 174 and are preferentially illuminated by LEDs in zone 1. Wavelength converting materials 192A and 192B cover another portion of transmissive element 174 and are preferentially illuminated by LEDs in zone 2. LEDs in zone 3, preferentially illuminate other wavelength converting materials present in different areas of transmissive element 174 (not shown).

Figure 18:
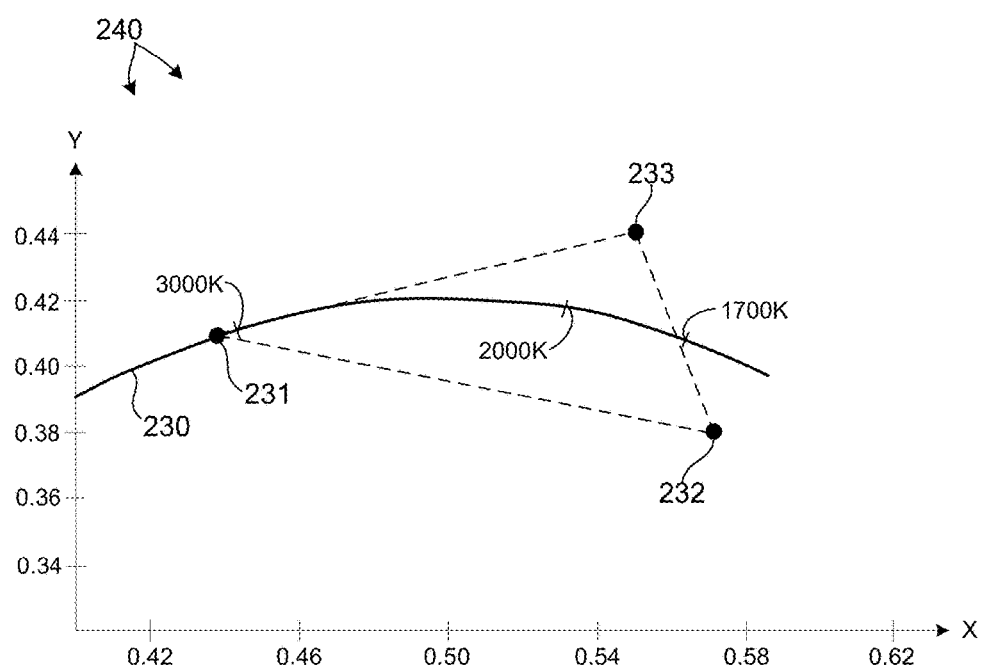
FIG. 18 illustrates a range of color points achievable by the LED based illumination device 100 depicted in FIGS. 16 and 17.

FIG. 18 illustrates a range of color points achievable by the LED based illumination device 100 depicted in FIGS. 16 and 17. When a current is supplied to LEDs in zone 3, light emitted from LED based illumination device 100 has a color point 231 illustrated in FIG. 18. Light emitted from LED based illumination device 100 has a color point within a degree of departure Δxy of 0.010 in the CIE 1931 xy diagram from a target color point of less than 5,000 Kelvin on the Planckian locus when current is supplied to LEDs in zone 3 and substantially no current is supplied to LEDs in zones 1 and 2. When current source 183 supplies current 184 to LEDs in preferential zone 1, the light emitted from LED based illumination device 100 has a color point 232. Light emitted from LED based illumination device 100 has a color point within a degree of departure Δxy of 0.010 in the CIE 1931 xy diagram from a target color point below the Planckian locus in the CIE 1931 xy diagram with a CCT less than 1,800 Kelvin when current is supplied to LEDs in zone 1 and substantially no current is supplied to LEDs in zones 2 and 3. When current source 182 supplies current 185 to LEDs in preferential zone 2, the light emitted from LED based illumination device 100 has a color point 233. Light emitted from LED based illumination device 100 has a color point within a degree of departure Δxy of 0.010 in the CIE 1931 xy diagram from a target color point above the Planckian locus 230 in the CIE 1931 xy diagram 240 with a CCT less than 3,000 Kelvin when current is supplied to LEDs in zone 2 and substantially no current is supplied to LEDs in zones 1 and 3.

By adjusting the currents supplied to LEDs located in zones 1, 2, and 3, the light emitted from LED based illumination module 100 can be tuned to any color point within a triangle connecting color points 231-233 illustrated in FIG. 18. In this manner, the light emitted from LED based illumination module 100 can be tuned to achieve any CCT from a relatively high CCT (e.g., approximately 3,000 Kelvin) to a relatively low CCT (e.g., below 1,800 Kelvin). Moreover, by tuning the realized color points 231, 232, and 233 within a predetermined tolerance (e.g., Δxy of 0.010 in the CIE 1931 xy diagram, Δu'v' of 0.009 in the CIE 1976 u'v' diagram, Δu'v' of 0.003 in the CIE 1976 u'v' diagram, etc.) of each respective target color point, each LED based illumination device 100 may be adjusted to the same color point in the same manner.

With multiple zones of LEDs each illuminating two or more wavelength converting materials, the LED based illumination device 100 may produce multiple predetermined or target color points with a high degree of accuracy without calibrating the ratio of currents supplied to LEDs in different zones for each LED based illumination device.

Figure 19:
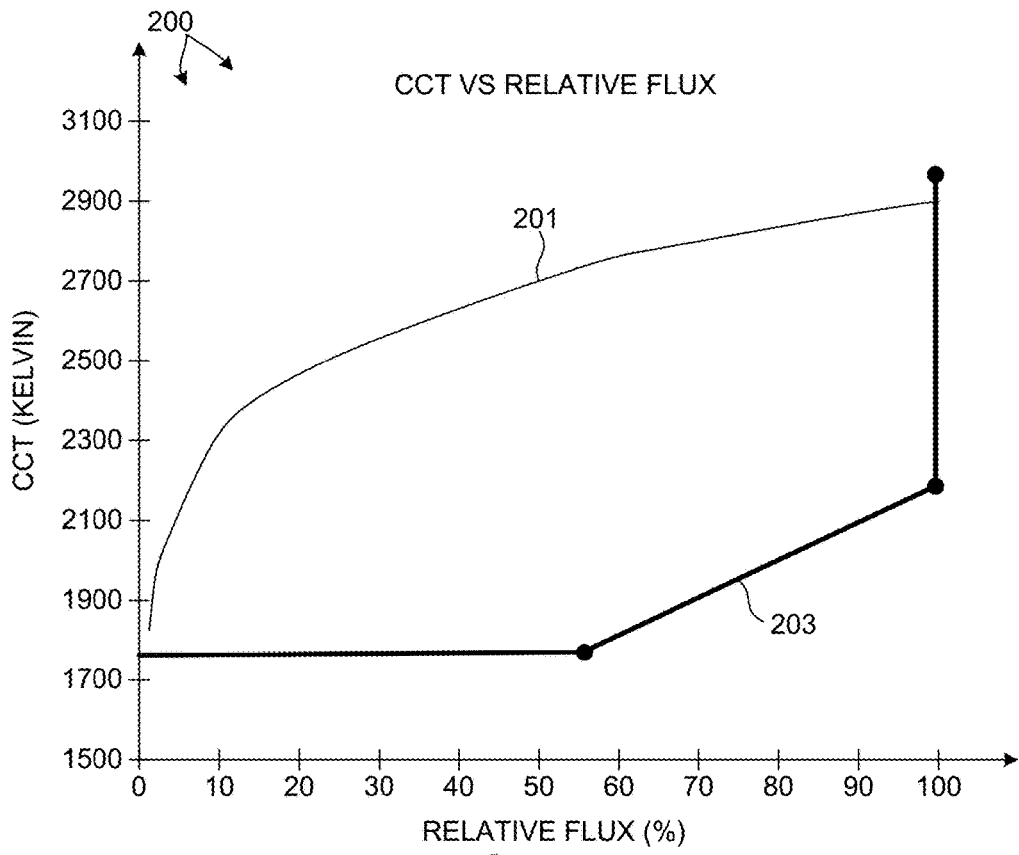
FIG. 19 is a graph illustrating an achievable relationship between CCT and relative flux for the embodiment illustrated in FIGS. 16-17.

As illustrated in FIG. 19, plotline 203 exhibits one achievable relationship between CCT and relative flux for the embodiment illustrated in FIGS. 16-17. As illustrated in FIG. 19, it is possible to reduce the CCT of light emitted from LED based illumination device 100 from 3,000 Kelvin to approximately 2,200 Kelvin without a loss of flux. Further reductions in CCT can be obtained from 2,200 Kelvin to approximately 1,750 Kelvin with an approximately linear reduction in relative flux from 100% to 55%. Relative flux can be further reduced without a change in CCT by reducing current supplied to LEDs of LED based illumination device 100. Plotline 203 is presented by way of example to illustrate that LED based illumination device 100 may be configured to achieve relatively large changes in CCT with relatively small changes in flux levels (e.g., as illustrated in line 203 from 55-100% relative flux) and also achieve relatively large changes in flux level with relatively small changes in CCT (e.g., as illustrated in line 203 from 0-55% relative flux). However, many other dimming characteristics may be achieved by reconfiguring both the relative and absolute currents supplied to LEDs in different preferential zones.

For reference, plotline 201 is based on experimental data collected from a 35 W halogen lamp. As illustrated, at the maximum rated power level, the 35 W halogen lamp light emission was 2900K. As the halogen lamp is dimmed to lower relative flux levels, the CCT of light output from the halogen lamp is reduced. For example, at 25% relative flux, the CCT of the light emitted from the halogen lamp is approximately 2500K. To achieve further reductions in CCT, the halogen lamp must be dimmed to very low relative flux levels. For example, to achieve a CCT less than 2100K, the halogen lamp must be driven to a relative flux level of less than 5%. Although, a traditional halogen lamp is capable of achieving CCT levels below 2100K, it is able to do so only by severely reducing the intensity of light emitted from each lamp. Moreover, there is no flexibility to independently adjust flux levels and color point with a halogen lamp.

The aforementioned embodiment is provided by way of example. Many other combinations of different zones of independently controlled LEDs preferentially illuminating different color converting materials may be contemplated to achieve a desired dimming characteristic.

Figure 20:
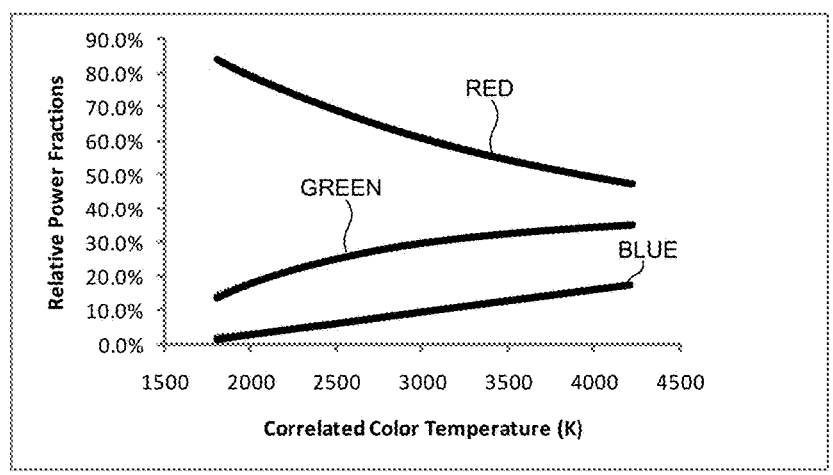
FIG. 20 illustrates a plot of simulated relative power fractions necessary to achieve a range of CCTs for light emitted from an LED based illumination module.

FIG. 20 illustrates a plot 210 of simulated relative power fractions necessary to achieve a range of CCTs for light emitted from an LED based illumination module 100. The relative power fractions describe the relative contribution of three different light emitting elements within LED based illumination module 100: an array of blue emitting LEDs, an amount of green emitting phosphor (model BG201A manufactured by Mitsubishi, Japan), and an amount of red emitting phosphor (model BR102D manufactured by Mitsubishi, Japan). As illustrated in FIG. 20, contributions from a red emitting element must dominate over both green and blue emission to achieve a CCT level below 2100K. In addition, blue emission must be significantly attenuated.

Changes in CCT over the full operational range of an LED based illumination device 100 may be achieved by employing LEDs with similar emission characteristics (e.g., all blue emitting LEDs) that preferentially illuminate different color converting materials. Changes in CCT over the operational range may also be achieved by introducing LEDs with different emission characteristics that preferentially illuminate different color converting materials.

Figure 21:
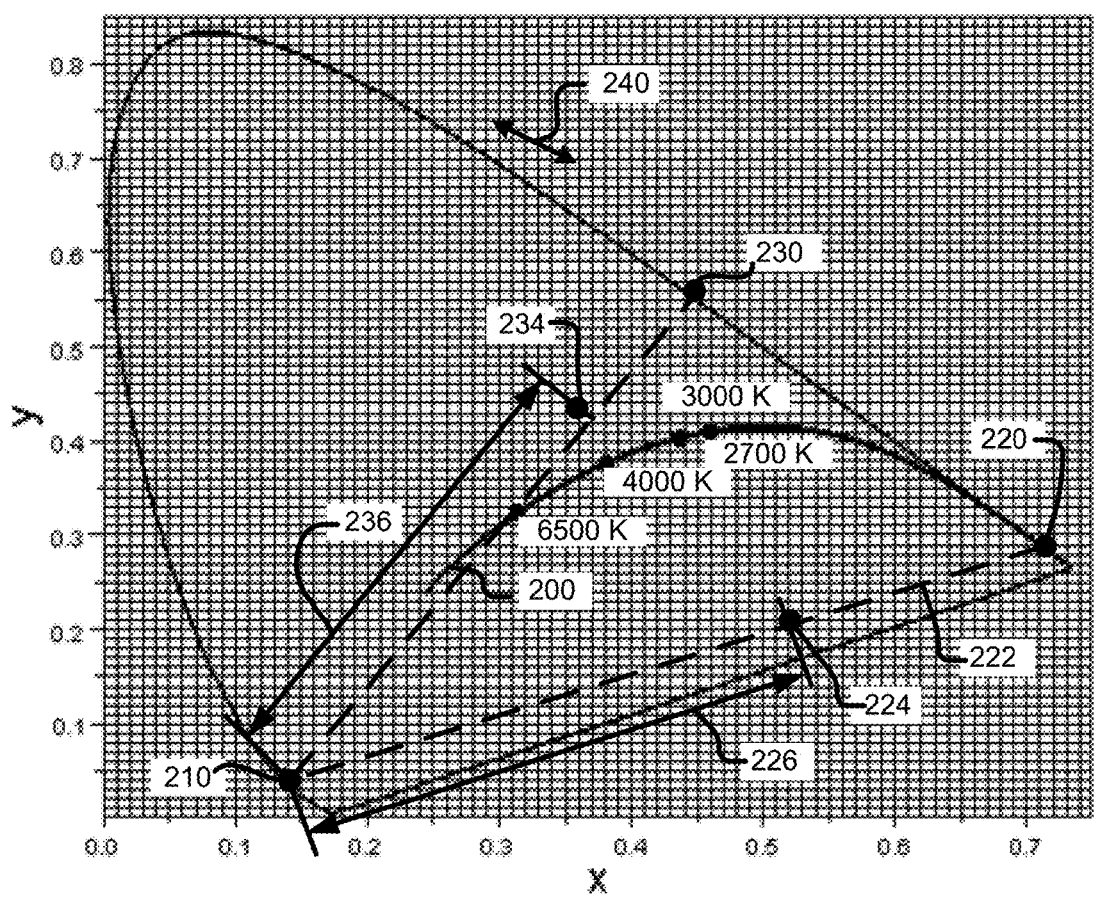
FIG. 21 is illustrative of a (xy) chromaticity diagram based on the CIE 1931 XYZ color space.

FIG. 21 is illustrative of a (xy) chromaticity diagram based on the CIE 1931 XYZ color space. The CIE 1931 color space is based on three color matching functions. The three tristimulus values express the CIE 1931 XYZ color space as a three dimensional color space. Each color matching function relates a given spectrum, S(λ), to each of the three tristimulus values, X, Y, and Z, as described in equation (1).

$$X_{1931} = \int CMF_X S(\lambda) d\lambda$$
$$Y_{1931} = \int CMF_Y S(\lambda) d\lambda$$
$$Z_{1931} = \int CMF_Z S(\lambda) d\lambda \qquad (1)$$

The xy chromaticity diagram of FIG. 21 is a projection of the three dimensional CIE 1931 XYZ color space onto a two dimensional space (xy) such that brightness is ignored. Each color coordinate (x,y) may be expressed as a function of the three tristimulus values as described in equation (2).

$$x = \frac{X}{X+Y+Z} \qquad (2)$$
$$y = \frac{Y}{X+Y+Z}$$

There are other color spaces that are simple projective transformations of the CIE 1931 XYZ color space. For example, both the CIE 1960 uniform color scale (CIE 1960 UCS) and the CIE 1976 uniform color scale (CIE 1976 UCS) are simple transformations of the CIE 1931 XYZ color space. The CIE 1960 UCS expresses two dimensional chromaticity (uv) as a function of the three tristimulus values as described in equation (3).

$$u = \frac{4X}{X+15Y+3Z} \qquad (3)$$
$$v = \frac{6Y}{X+15Y+3Z}$$

The CIE 1976 UCS expresses two dimensional chromaticity (u'v') as a function of the three tristimulus values as described in equation (4).

$$u' = \frac{4X}{X+15Y+3Z} \qquad (4)$$
$$v' = \frac{9Y}{X+15Y+3Z}$$

Figure 22:
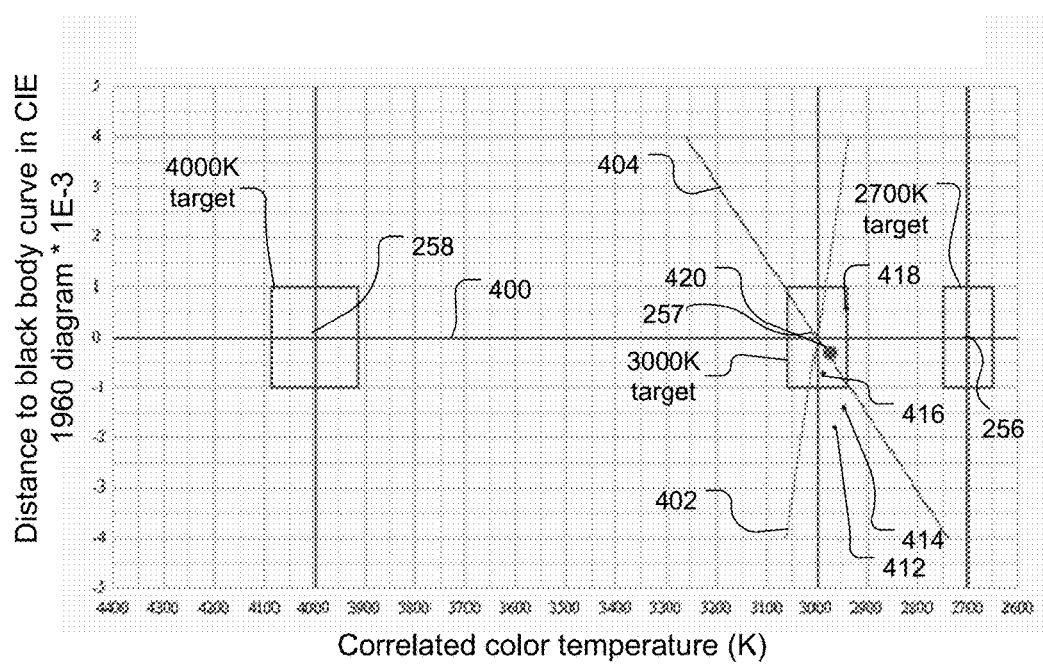
FIG. 22 is a diagram illustrating color points of LED devices and predetermined target color points on the black-body curve from the CIE 1960 UCS diagram where the horizontal axis represents CCT and the vertical axis represents the degree of departure ($\Delta$uv) from the black-body curve.

The CIE 1960 UCS color space has generally been superseded by the CIE 1976 UCS color space as an expression of uniform chromaticity. However, the CIE 1960 UCS color space is still useful as an expression of chromaticity because the isothermal lines of correlated color temperature (CCT) are aligned perpendicular to the Planckian locus in CIE 1960 UCS. In the context of the CIE 1960 UCS, the degree of departure is the distance between the color point of the light produced by the light source and the Planckian locus along a line of constant CCT. The degree of departure is referred to in units of Δuv in CIE 1960 UCS. Thus, the color point of a white light source may be described as a CCT value and a Δuv value, i.e., the degree of departure from the black-body curve as measured in the CIE 1960 color space. It follows that the specification for color of light output by LED based illumination device 100 can be expressed as a CCT value within a predetermined tolerance and a Δuv value within a predetermined tolerance. FIG. 22 illustrates a plot of the black-body curve 400, sometimes referred to as a Planckian locus, parallel to the horizontal axis and units of Δuv along the vertical axis in the context of the CIE 1960 chromaticity diagram. Target color points 256-258 are illustrated as exemplary target color points. The degree of departure from the target color point is referred to in units of Δuv. When the color point of a light source varies significantly from a predetermined target color point, the color of the light will be perceptively different from the desired color. Moreover when light sources are near each other, e.g., in accent lighting or a display, even slight color differences are noticeable and considered undesirable.

Producing light sources that generate light near a target color point is desirable. For example, when used for purposes of general illumination, it is desirable that the LED based illumination device 100 produce white light with a particular correlated color temperature (CCT). CCT relates to the temperature of a black-body radiator and temperatures between 2700K and 6000K are typically useful for general illumination purposes. Higher color temperatures are considered "cool" as they are bluish in color, while lower temperatures are considered "warm" as they contain more yellow-red colors. By way of example, CCTs of 2700K, 3000K, 3500K, 4000K, 4200K, 5000K, 6500K are often desirable. In another example, light emitted from an LED based illumination device targeting any of CIE illuminant series A, B, C, D, E, and F are desirable.

As illustrated in FIG. 21, the chromaticity of a black-body radiator in CIE 1931 color space is represented by curve 200. This curve is sometimes referred to as the Planckian locus. Ideally, light sources produce light that lies on the black-body curve 200 at a target color point. In practice, however, producing light at a target color point on the black-body curve 200 is difficult, particularly with an LED light source because of the lack of precise control over the light output of an LED light source manufactured using current processes. Typically, there will be some distance between the color point of the light produced by the light source and the target color point on the black-body curve 200, which is known as the degree of departure from the target color point on the black-body curve.

An LED is typically binned after a production run based on a variety of characteristics derived from their spectral power distribution. The cost of the LEDs is determined by the size (distribution) of the bin. For example, a particular LED may be binned based on the value of its peak wavelength. The peak wavelength of an LED is the wavelength where the magnitude of its spectral power distribution is maximal. Peak wavelength is a common metric to characterize the color aspect of the spectral power distribution of blue LEDs. Many other metrics are commonly used to bin LEDs based on their spectral power distribution (e.g. dominant wavelength, xy color point, uv color point, etc.). It is common for blue LEDs to be separated for sale into bins with a range of peak wavelength of five nanometers.

As discussed above, LED based illumination device 100 includes a board 104 with a plurality of LEDs 102. The plurality of LEDs 102 populating board 104 are operable to produce light with a particular spectral power distribution. The color aspect of this spectral power distribution may be characterized by its centroid wavelength. A centroid wavelength is the wavelength at which half of the area of the spectral power distribution is based on contributions from wavelengths less than the centroid wavelength and the other half of the area of the spectral power distribution is based on contributions from wavelengths greater than the centroid wavelength. For a plurality of boards, a standard deviation of the centroid wavelength can be calculated. In some production examples a standard deviation of the centroid wavelength of a plurality of boards may be less than 0.1 nm, e.g., where the boards are populated with LEDs carefully selected for their closely matching spectral power distribution or LEDs from a small bin. Of course, costs increase significantly when producing boards with a standard deviation of the centroid wavelength of approximately 0.1 nm or less. In other examples, a standard deviation of the centroid wavelength of a plurality of boards may be less than 0.5 nm. In yet other examples, a standard deviation of the centroid wavelength of a plurality of boards may be less than 2.0 nm.

The LED based illumination device 100 can accommodate LEDs with a wide spectral power distribution while still achieving a target color point within a predetermined tolerance. Moreover, multiple LED based illumination devices 100 may be produced, each with one or more LEDs having different spectral power distributions, e.g., a large standard deviation of the centroid wavelength, while still achieving closely matched color points from one LED based illumination device 100 to the next, and where the matching color points of the LED based illumination devices 100 are within a predetermined tolerance from a target color point. Thus, less expensive LEDs may be used. By using two or more wavelength converting materials, the color point of the light emitted by the LED based illumination device 100 may be accurately controlled. In one aspect, the amounts of the two or more wavelength converting materials may be modified based on a color measurement of an assembled LED based illumination device such that the modified LED based illumination device emits light within a predetermined tolerance of a target color point. The amounts of the wavelength converting materials may be modified to produce a desired degree of departure of $\Delta u'v'$ between 0.009 and 0.0035 and smaller if desired, such as 0.002.

Figure 23:
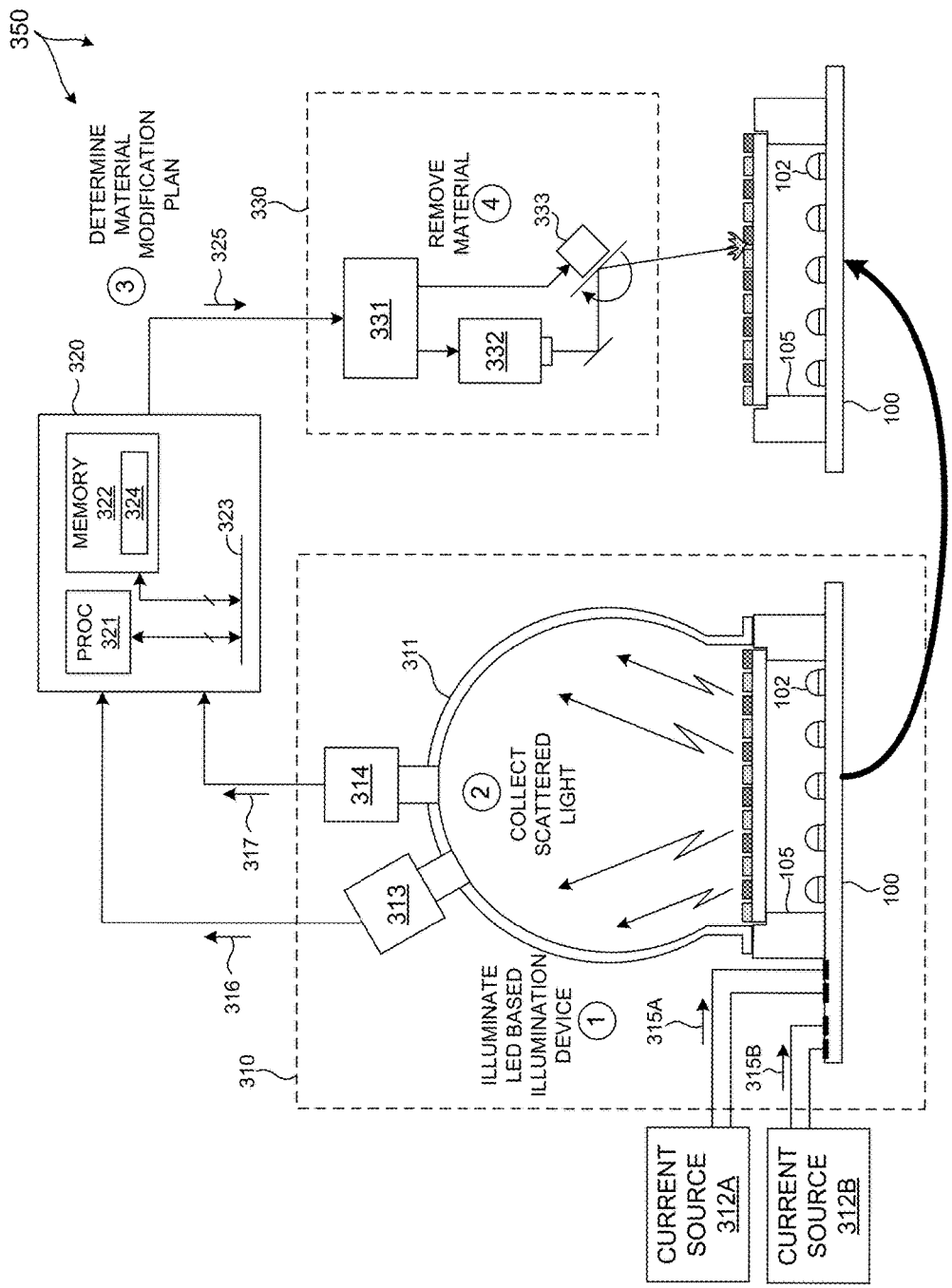
FIG. 23 is illustrative of a system for automatically tuning the color of light emitted from an assembled LED based illumination device within a predefined tolerance of a target color point by removing portions of two different wavelength converting materials.

FIG. 23 is illustrative of a system 350 for automatically tuning the color of light emitted from an assembled LED based illumination device 100 within a predefined tolerance of a target color point by removing portions of two different wavelength converting materials. Although, as illustrated, system 350 automatically tunes LED based illumination device 100 by removal of wavelength converting material, system 350 may also be configured to tune LED based illumination device 100 by addition of wavelength converting materials.

System 350 includes an optical detection system 310, a material modification planning tool 320, and a material modification system 330. In the embodiment illustrated in FIG. 14, optical detection system 310 includes an integrating sphere 311 and a spectrometer 313. In addition, optical detection system 310 includes an optional camera system 314 to image the light emitted from the surface of LED based illumination device 100. Optical detection system 310 is configured to measure the color of light emitted from an LED based illumination device 100 under test. Although an integrating sphere 311 and spectrometer 313 may be employed to measure the color of light emitted from an LED based illumination device 100, other measurement devices may be contemplated. For example, light emitted from LED based illumination device 100 may be filtered by three color filters, each configured to mimic the CIE color matching functions. After filtering, light detected by a photometer may be used to determine the three tristimulus values described with reference to Equation 1. Other exemplary color measurement techniques may be contemplated.

Material modification planning tool 320 includes a processor 321 and an amount of processor readable memory 322. In the illustrated example, processor 321 and memory 322 are configured to communicate over a bus 323. Memory 322 includes an amount of memory 324 storing instructions that, when executed by processor 321, implement material modification planning functionality as described herein.

In the illustrated embodiment, material modification system 330 includes a controller 331, a laser light source 332, and a galvo scanner 333. Based on a material modification plan generated by material modification planning tool 320, controller 331 controls laser 332 and galvo scanner 333 to direct radiation emitted from laser 332 to LED based illumination device 100. The incident radiation ablates a portion of a first wavelength converting material and a portion of a second wavelength converting material such that the modified LED based illumination device 100 emits colored light within a predetermined tolerance of a target color point. In addition to the illustrated embodiment, other material modification systems 330 may be contemplated. For example, a laser based ablation system may employ a variety of motion control schemes to precisely direct laser light onto LED based illumination device 100. For example, a motion system may be used to move the LED based illumination device in one direction and the laser in an orthogonal direction in a coordinated manner. Such a motion system may be employed to precisely direct laser light alone or in combination with a scanning mirror system. In some other examples, material modification system 330 may be a mechanical scribing system that mechanically removes material from LED based illumination device. Material modification systems 330 based on ion etching, chemical etching, electrical discharge machining, plasma etching, and chemical mechanical polishing may also be contemplated.

In some other examples, material modification system 330 may add material to LED based illumination device 100 to precisely modify the amounts of two different wavelength converting materials. By way of example, jet dispensing, spray coating, screen printing, and blade coating may be employed to precisely add at least two different wavelength converting materials to LED based illumination device 100 to tune the color of light emitted from LED based illumination device 100 within a predetermined tolerance of a target color point.

Figure 25:
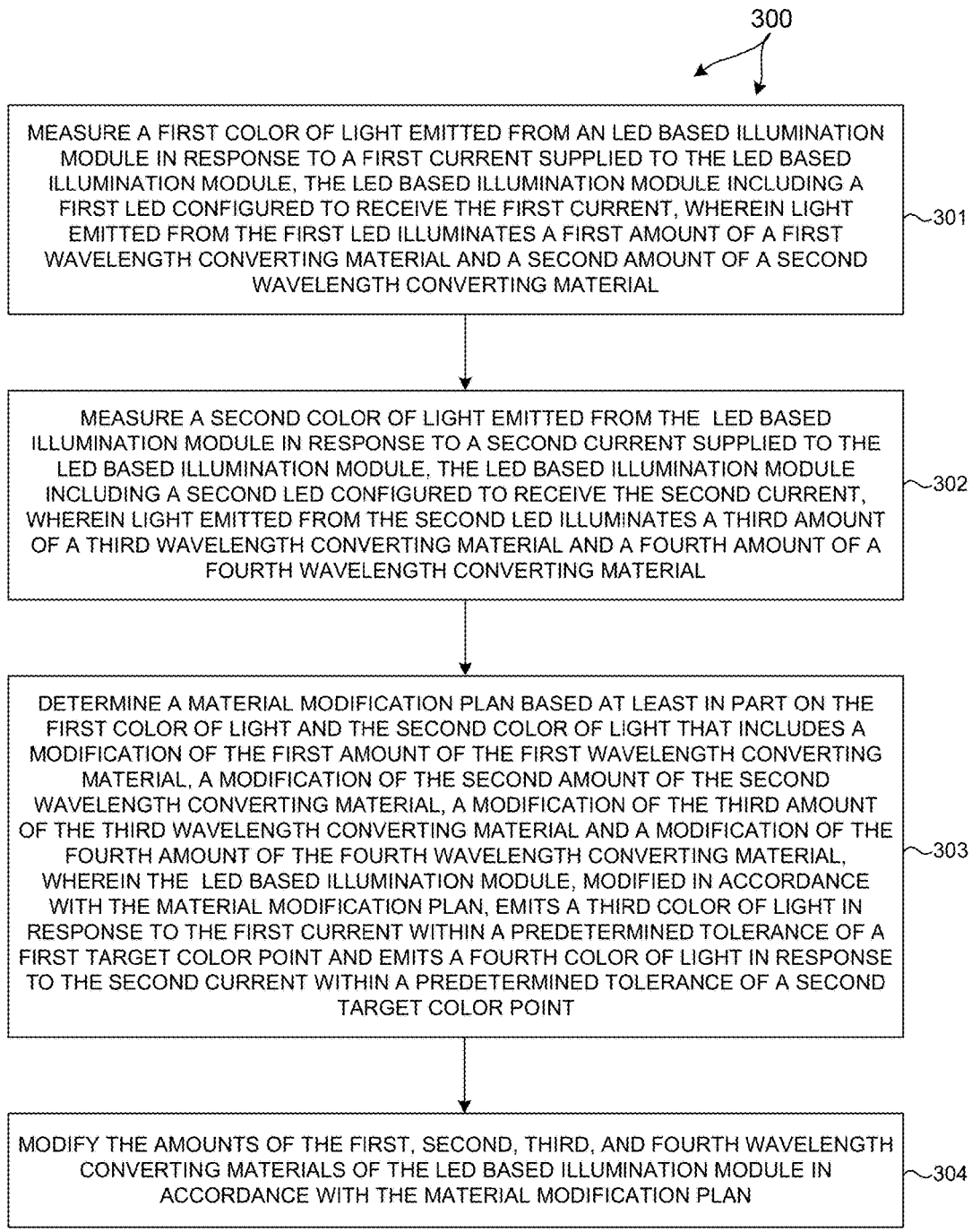
FIG. 25 illustrates a method of automatically tuning the color of light emitted from an assembled LED based illumination device within a predefined tolerance of a target color point by modifying portions of at least two different wavelength converting materials.

FIG. 25 illustrates a method 300 of automatically tuning multiple colors of light emitted from an assembled LED based illumination device 100 within a predefined tolerance of multiple target color points by modifying portions of at least two different wavelength converting materials associated with each color. For illustrative purposes, method 300 is described with reference to system 350 illustrated in FIG. 23. However, the execution of the elements of method 300 is not limited to the specific embodiments described with reference to FIG. 23.

In block 301, a first color of light emitted by LED based illumination device 100 is measured. LED based illumination device 100 is configured to receive a first current. One or more LEDs in zone 1 are configured to illuminate in response to the first current. LED based illumination device 100 also includes two different wavelength converting materials that are illuminated by the LED(s) in zone 1. As illustrated in FIG. 23, an electrical power source (e.g., current source 312A) supplies electrical power (e.g., current 315A) to LED based illumination device 100. In response LED based illumination device 100 emits light having a first color. The emitted light is collected by integrating sphere 311. By collecting the light in integrating sphere 311, the sample of light collected by spectrometer 313 effectively represents an averaged color of light emitted from LED based illumination device 100. Spectrometer 313 is configured to determine the color of light emitted by LED based illumination device 100 and communicate a signal 316 indicative of the measured color to material modification planning tool 320.

In block 302, a second color of light emitted by LED based illumination device 100 is measured. LED based illumination device 100 is configured to receive a second current. One or more LEDs in zone 2 are configured to illuminate in response to the second current. LED based illumination device 100 also includes two different wavelength converting materials that are illuminated by the LED(s) in zone 2. As illustrated in FIG. 23, an electrical power source (e.g., current source 312B) supplies electrical power (e.g., current 315B) to LED based illumination device 100. In response LED based illumination device 100 emits light having a second color. The emitted light is collected by integrating sphere 311. Spectrometer 313 is configured to determine the color of light emitted by LED based illumination device 100 and communicate a signal 316 indicative of the measured color to material modification planning tool 320.

In block 303, material modification planning tool 320 determines a material modification plan that includes a modification of the amount of first, second, third, and fourth wavelength converting materials (e.g., wavelength converting materials 191A, 191B, 192A, and 192B). As modified, the LED based illumination device will emit a color of light within a predetermined tolerance of a first target color point in response to the first current and emit a color of light within a predetermined tolerance of a second target color point in response to the second current.

By way of example, the color point shifts associated with each of the first and second wavelength converting materials is illustrated in the CIE 1931 chromaticity diagram of FIG. 21. The color point of the test light source, which produces blue light at, e.g., 445 nm, is illustrated as point 210 in the diagram. The color point produced by, e.g., wavelength converting material 180 on or within transmissive plate 174 is illustrated as point 220, which corresponds with a dominant wavelength of, e.g., 630 nm. The color point shift produced by wavelength converting material 180 with the test light source is along the dotted line 222, where the amount of the shift will depend on the geometry of the LED based illumination device 100 and the thickness and/or concentration of the wavelength converting material 180 on the transmissive plate 174. By way of example, the measured color point produced by wavelength converting material 180 is illustrated by point 224 and the shift Δxy from the color point produced by the test light source without wavelength converting material 180 (e.g., point 210) is illustrated by line 226.

The color point produced by, e.g., the wavelength converting material 181 on or within transmissive plate 174, is illustrated as point 230 which corresponds with a dominant wavelength of, e.g., 570 nm. The color point shift produced by wavelength converting material 181 with the test light source is along the dotted line 232 depending on the thickness and/or concentration of the wavelength converting material 181 on the transmissive plate 174. By way of example, the measured color point produced by wavelength converting material 181 with the test light source is illustrated by point 234 and the shift Δxy from the color point produced by the test light source without wavelength converting material 181 (e.g., point 210) is illustrated by line 236. If desired, different formulations of the wavelength converting materials may also be used, which would alter the color point produced by the wavelength converting materials (as illustrated by arrow 240), and thus, the slope of the color point shift.

Typically, there is a difference in spectral power distribution from one LED to the next. For example, LEDs that are supposed to produce blue light at 452 nm will typically produce light that may range between 450 nm and 455 nm or more. In another example, LEDs that are supposed to produce blue light may produce light that ranges between 440 nm and 475 nm. In this example, the spectral power distribution from one LED to another may be as much as eight percent. The variation in the spectral power distribution of LEDs is one of the reasons why producing LED based light sources with consistent and accurate color points is difficult. However, because the LED based illumination device 100 includes two or more wavelength converting components with wavelength converting materials that can be individually modified, appropriate wavelength converting characteristics can be tuned for a large variation of spectral power distributions of LEDs 102 to produce a color point that is within a predetermined tolerance, e.g., a Δu'v' of less than 0.0035, from a target color point. The target color point may be, e.g., a CCT of 2700K, 3000K, 4000K, or other temperature on the black-body curve, or alternatively, the target color point may be off of the black-body curve.

FIG. 22 is a diagram illustrating color points of LED devices and predetermined target color points on the black-body curve from the CIE 1960 UCS diagram where the horizontal axis represents CCT and the vertical axis represents the degree of departure (Δuv) from the black-body curve 400. The target color points may be, e.g., 4000K, 3000K and 2700K on the black-body curve 400. Other target CCTs or color points off of the black-body curve 400 may be used if desired. FIG. 22 illustrates a predetermined tolerance for each of the target color points with a rectangle. For example, at the target color point at 4000K the CCT may vary by ±90K, while at 3000K the CCT may vary by ±55K, and at 2700K the CCT may vary by ±50K. These predefined tolerances for CCT are within a two step MacAdam ellipse centered on each respective target color point on the black-body curve. The predetermined tolerance for the departure from the black-body curve Δuv for each CCT is ±0.001. In this example, Δuv may vary by a distance of 0.001 above the black-body curve 400 (expressed as a positive tolerance value, +0.001) and may vary by a distance of 0.001 below the black-body curve 400 (expressed as a negative tolerance value, −0.001). This predetermined tolerance for Δuv is within a one step MacAdam ellipse centered on each respective target color point on the black-body curve. The predetermined tolerances for CCT and Δuv illustrated in FIG. 22 is within a two step MacAdam ellipse and also within the tolerance of Δu'v' of 0.0035. The color points within the illustrated tolerance from the target color points are so close that the color difference is indistinguishable for most people even when the light sources are viewed side by side.

The diagram illustrates two color lines centered on the 3000K CCT for reference purposes. One color line 402 corresponds to the color point shift produced by a first wavelength converting material. In the present example, color line 402 is a yellow phosphor coating on the transmissive plate 174. Color line 404 corresponds to the color point shift produced by a second wavelength converting material. In the present example, color line 404 is a red phosphor coating on the transmissive plate 174. Color line 402 indicates the direction of a shift in color point of light produced by the yellow phosphor. Color line 404 indicates the direction of shift in color point produced by the red phosphor. The first wavelength converting material and the second wavelength converting material are selected such that their respective directions of shift in color point are not parallel. Because the direction of shift of the yellow phosphor and the red phosphor are not parallel, the direction of the color point shift of light emitted by LED based illumination device 100 can be arbitrarily designated. This may be achieved by modifying the amount of each phosphor as discussed above. By way of example, the small spots, 412, 414, 416, and 418 graphically illustrate the color points produced by one LED based illumination device 100 using different amounts of wavelength converting materials. For example, spot 412 illustrates the color point for the LED based illumination device 100 with one set of amounts of the two different wavelength converting materials. By modifying the amount of yellow phosphor, the color point shifted for the LED based illumination device 100 to spot 414. As can be seen, the difference in the color points from spot 412 to 414 is parallel with the color line 402. By modifying the amount of red phosphor, the color shifts from spot 414 to spot 416 which is parallel with the color line 404. While this is within the 3000K target, an additional modification of the amount of yellow phosphor results in a color point illustrated by spot 418, where the shift between spot 416 and 418 is parallel with the color line 402. By again modifying the amount of yellow phosphor the color point of the LED based illumination device 100 shifts along line 402 to produce a color point illustrated by large spot 420, which is well within the predetermined tolerance from the target color point of 3,000K on the black-body curve.

Material modification planning tool 320 determines the modification of each amount of the first and second wavelength converting materials (e.g., wavelength converting materials 191A and 191B) to change the color of light measured in block 301 to a first target color point within a predetermined tolerance. Similarly, material modification planning tool 320 determines the modification of each amount of the third and fourth wavelength converting materials (e.g., wavelength converting materials 192A and 192B) to change the color of light measured in block 302 to a second target color point within a predetermined tolerance. The modification of each amount of wavelength converting material is based on the direction of color shift associated with each wavelength converting material and the magnitude of color shift associated with different amounts of each wavelength converting material. Material modification planning tool 320 communicates a signal 325 indicative of the material modification plan to material modification tool 330. The material modification plan includes the amount of each wavelength material to be modified and the location on LED based illumination device 100 where each wavelength converting material should be modified.

In block 304, material modification tool 330 modifies the amounts of the wavelength converting materials in accordance with the material modification plan. For example, as illustrated in FIG. 23, controller 331 receives signal 325 indicative of the material modification plan. In response, controller 331 controls the laser power output of laser 332 and galvo scanner 333 to remove a portion of each different wavelength converting material in accordance with the material modification plan.

Figure 24:
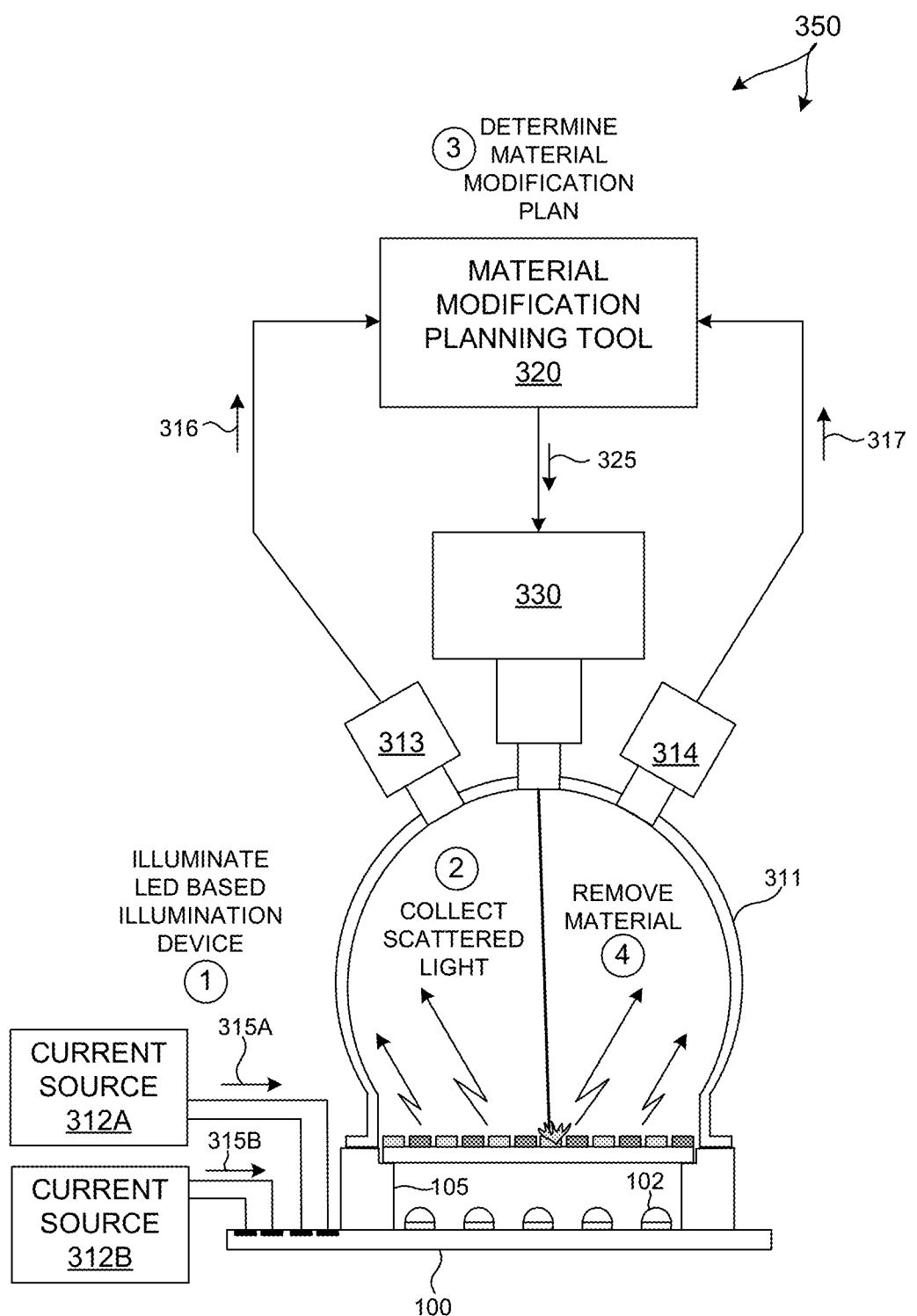
FIG. 24 is illustrative of another embodiment of a system for automatically tuning the color of light emitted from an assembled LED based illumination device within a predefined tolerance of a target color point by removing portions of two different wavelength converting materials.

FIG. 24 is illustrative of system 350 in another embodiment. In the illustrated embodiment, the optical detection system 310 and the material modification system 330 are implemented on a common mechanical platform. In this manner, LED based illumination device 100 does not have to be transported to separate process stations for color measurement and material modification.

To tune the color point of light emitted from an LED based illumination device 100, material modification planning tool 320 determines the appropriate modification to each amount of wavelength converting material necessary to achieve the desired color shift. However, in addition, material modification planning tool 320 also determines where the material modification should occur. In some examples, a thin line or set of lines of wavelength converting material may be added or removed in specific locations of LED based illumination device 100. In some other examples, a series of dots of wavelength converting material may be added or removed in specific locations of LED based illumination device 100.

In another aspect, material modification planning tool 320 determines where material modification should occur based on another performance metric of LED based illumination device 100, in addition to color point.

Figure 26:
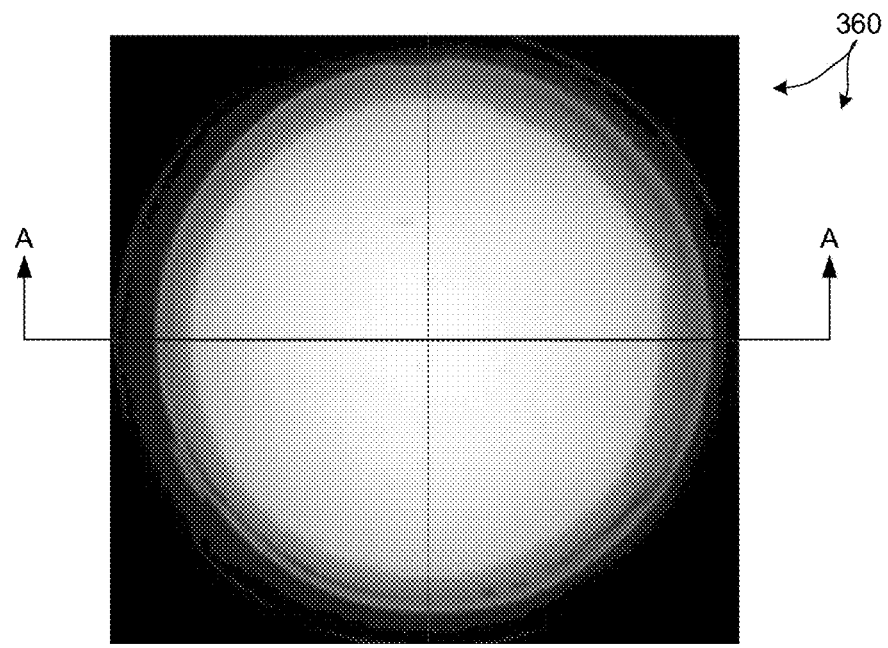
FIG. 26 is illustrative of an image collected by a camera of the light emitting surface of LED based illumination device.
Figure 27:
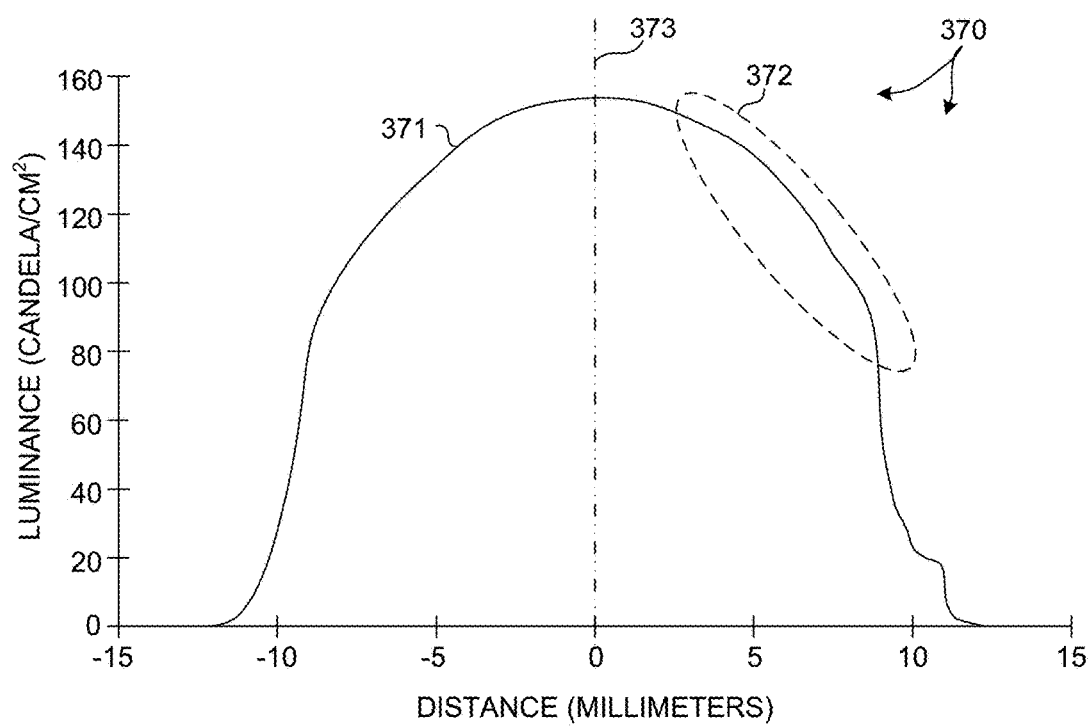
FIG. 27 is a plot illustrative of the luminance across the emitting surface of LED based illumination device at Section line A illustrated in FIG. 26.

In one example, the location of a material modification is based at least in part on an output beam intensity distribution of the LED based illumination device. FIG. 26 is illustrative of an image 360 collected by a camera (e.g., camera 314) of the light emitting surface of LED based illumination device 100. In one example, this image information 317 is communicated to material modification planning tool 320 as illustrated in FIGS. 23 and 24. FIG. 27 is a plot 370 illustrative of the luminance 371 across the emitting surface of LED based illumination device 100 at Section line A illustrated in FIG. 26. As highlighted in FIG. 27, the luminance at the emitting surface of LED based illumination device 100 is not perfectly symmetric. For example, portion 372 highlighted in FIG. 27 exhibits greater luminance than a corresponding portion opposite axis 373. Based on this measurement, material modification planning tool 320 determines a material modification plan that adds wavelength converting materials needed to reach the target color point in the area of portion 372 such that the luminance of the modified device is exhibits improved output beam uniformity.

Figure 28:
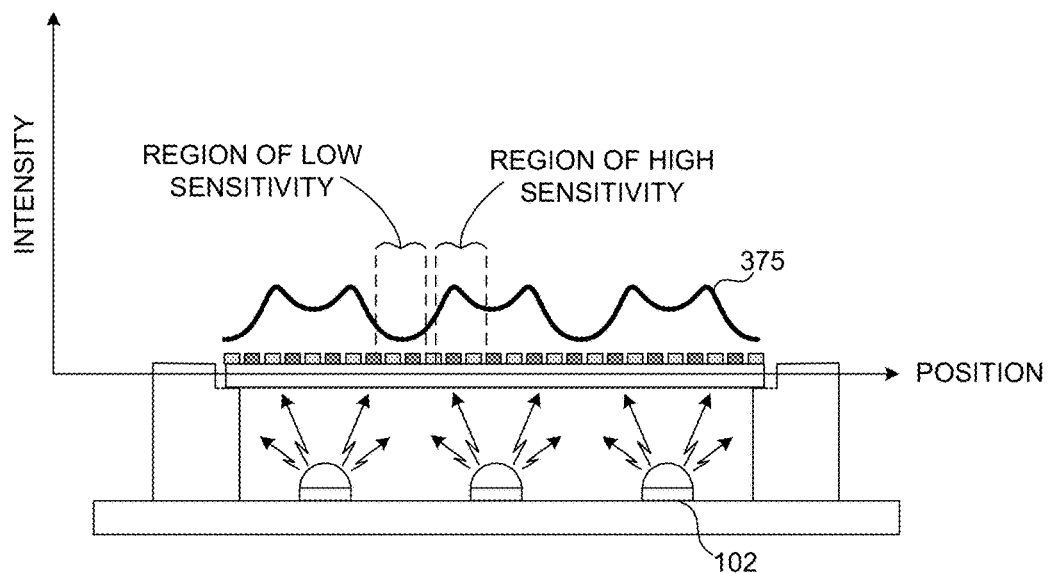
FIG. 28 shows an illustrative plotline indicative of a spatial variation in intensity of light emitted from LEDs in a plane that is coplanar with transmissive plate.
Figure 29:
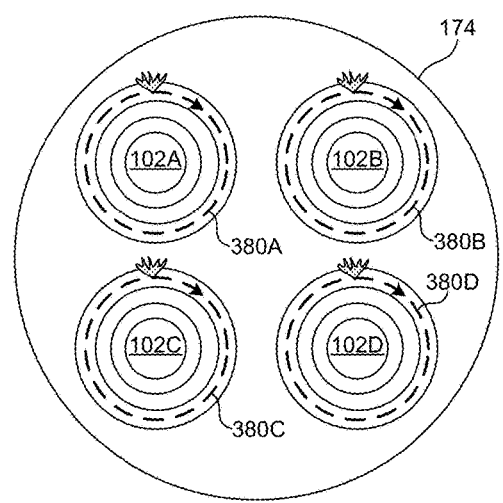
FIG. 29 is illustrative of a material modification plan that includes trajectories of material removal that are a fixed distance from each underlying LED location.

In another example, the location of a material modification is based at least in part on achieving an improved color conversion efficiency of the assembled LED based illumination device. FIG. 28 shows an illustrative plotline 375 indicative of a spatial variation in intensity of light emitted from LEDs 102 in a plane that is coplanar with transmissive plate 174. As a result of this spatial variation, wavelength converting material located on transmissive plate 174 is subjected to different levels of excitation light depending on location. For example, in areas of peak intensity the wavelength converting material may be more sensitive to changes in the amount of material compared to areas with less intensity. Thus, changes in the amount of wavelength converting material may have differing effect on color point and overall conversion efficiency based on their location. Based on the known emission pattern and the initial layout of the wavelength converting materials, material modification planning tool 320 determines a material modification plan that adds or removes wavelength converting materials needed to reach the target color point in areas that exhibit improved color conversion efficiency. For example in FIG.

29, a material modification plan includes trajectories of material removal 380A-D that are a fixed distance from each underlying LED location.

In yet another example, the location of a material modification is based at least in part on achieving an improved temperature distribution over a light emitting surface of the assembled LED based illumination device. An infrared image of the emission surface of transmissive plate 174 may be used to determine "hot spots" on the emission surface. These "hot spots" may indicate a disproportionate amount of color conversion. In response, material modification planning tool 320 determines a material modification plan that adds or removes wavelength converting materials needed to reach the target color point in areas that minimize "hot spots" on the emitting surface of LED based illumination device 100.

In yet another example, the location of a material modification is based at least in part on achieving an improved color uniformity over a light emitting surface of the assembled LED based illumination device. An image of the emission surface of transmissive plate 174 may be used to determine the color temperature at different locations on the emission surface. Differences in color temperature may indicate non-uniformity of material coatings or differences in peak emission wavelength of different LEDs 102. In response, material modification planning tool 320 determines a material modification plan to add or remove wavelength converting materials to reach the target average color point and also improves color temperature uniformity on the light emitting surface of LED based illumination device 100.

Although certain specific embodiments are described above for instructional purposes, the teachings of this patent document have general applicability and are not limited to the specific embodiments described above. For example, although LED based illumination device 100 is depicted as emitting from the top of the device (i.e., the side opposite the LED mounting board 104), in some other embodiments, LED based illumination device 100 may emit light from the side of the device (i.e., a side adjacent to the LED mounting board 104). In another example, any component of LED based illumination device 100 may be patterned with phosphor. Both the pattern itself and the phosphor composition may vary. In one embodiment, the illumination device may include different types of phosphors that are located at different areas of LED based illumination device 100. For example, a red phosphor may be located on the bottom side of transmissive plate 174 and yellow and green phosphors may be located on the top of transmissive plate 174. In one embodiment, different types of phosphors, e.g., red and green, may be located on different areas on transmissive plate 174 or shaped lens 172. For example, one type of phosphor may be patterned on transmissive plate 174 or shaped lens 172 at a first area, e.g., in stripes, spots, or other patterns, while another type of phosphor is located on a different second area of on transmissive plate 174 or shaped lens 172. If desired, additional phosphors may be used and located in different areas. Additionally, if desired, only a single type of wavelength converting material may be used and patterned on transmissive plate 174 or shaped lens 172. In another example, LED based illumination device 100 is depicted in FIGS. 1-3 as a part of a luminaire 150. As illustrated in FIG. 3, LED based illumination device 100 may be a part of a replacement lamp or retrofit lamp. But, in another embodiment, LED based illumination device 100 may be shaped as a replacement lamp or retrofit lamp and be considered as such. Accordingly, various modifications, adaptations, and combinations of various features of the described embodiments can be practiced without departing from the scope of the invention as set forth in the claims.

What is claimed is:

1. A method comprising:
    measuring a first color of light emitted from an LED based illumination device in response to a first current supplied to a first LED configured to receive the first current, wherein light emitted from the first LED illuminates a first amount of a first wavelength converting material;
    measuring a second color of light emitted from the LED based illumination device in response to a second current supplied to a second LED configured to receive the second current, wherein light emitted from the second LED illuminates a second amount of a second wavelength converting material; and
    determining a material modification plan based at least in part on the first color of light and the second color of light that includes a modification of the first amount of the first wavelength converting material, wherein the LED based illumination device, modified in accordance with the material modification plan, emits a third color of light in response to the first current within a predetermined tolerance of a first target color point.

2. The method of claim 1, wherein the material modification plan also includes a modification of the second amount of the second wavelength converting material, and wherein the LED based illumination device, modified in accordance with the material modification plan, emits a fourth color of light in response to the second current within a predetermined tolerance of a second target color point.

3. The method of claim 1, further comprising:
    modifying the first amount of the first wavelength converting material in accordance with the material modification plan.

4. The method of claim 3, wherein the modification of the first amount of the first wavelength converting material includes either adding or removing a portion of the first wavelength converting material.

5. The method of claim 4, wherein the material modification plan includes a location of the portion of the first wavelength converting material.

6. The method of claim 5, wherein the location of the portion of the first wavelength converting material is determined based at least in part on any of an output beam intensity distribution of the LED based illumination device, a color conversion efficiency of the LED based illumination device, and a temperature distribution over a light emitting surface of the LED based illumination device.

7. The method of claim 2, wherein the first amount of the first wavelength converting material and the second amount of the second wavelength converting material are located on a color conversion element of the LED based illumination device.

8. The method of claim 7, wherein the first amount of the first wavelength converting material and the second amount of the second wavelength converting material are physically separated from each other on the color conversion element of the LED based illumination device.

9. The method of claim 7, wherein the first amount of the first wavelength converting material is arranged on a first side of the color conversion element, and wherein the second amount of the second wavelength converting material is arranged on a second side of the color conversion element.

10. A method of tuning an assembled LED based illumination device comprising:
- providing the assembled LED based illumination device including an amount of a first wavelength converting material;
- measuring a first color of light emitted from the assembled LED based illumination device in response to a first current supplied to the assembled LED based illumination device, the assembled LED based illumination device including a first LED configured to receive the first current, wherein light emitted from the first LED illuminates at least the first wavelength converting material;
- measuring a second color of light emitted from the assembled LED based illumination device in response to a second current supplied to the assembled LED based illumination device, the assembled LED based illumination device including a second LED configured to receive the second current, and
- modifying the amount of the first wavelength converting material to change the first color of light emitted from the assembled LED based illumination device to a first target color point within a predetermined tolerance.

11. The method of claim 10, wherein the assembled LED based illumination device includes an amount of a second wavelength converting material, wherein light emitted from the second LED illuminates at least the second wavelength converting material.

12. The method of claim 11, further comprising:
- modifying the amount of the second wavelength converting material to change the second color of light emitted from the assembled LED based illumination device to a second target color point within a predetermined tolerance.

13. The method of claim 10, wherein the modifying of the amount of the first wavelength converting material includes any of adding a portion of the first wavelength converting material and removing a portion of the first wavelength converting material.

14. The method of claim 10, further comprising:
- determining a location where the modifying of the amount of the first wavelength converting material should occur.

15. The method of claim 14, wherein the determining of the location of the modifying of the amount of the first wavelength converting material is based on any of an output beam intensity distribution of the assembled LED based illumination device, a color conversion efficiency of the assembled LED based illumination device, a color uniformity of the assembled LED based illumination device, and a temperature distribution over a light emitting surface of LED based illumination device.

16. A non-transitory, computer-readable medium, storing instructions that when read by a processor, cause the processor to:
- receive an indication of a first light having a first color emitted from an LED based illumination device in response to a first current supplied to a first LED configured to receive the first current, wherein light emitted from the first LED illuminates at least a first amount of a first wavelength converting material;
- receive an indication of a second light having a second color emitted from the LED based illumination device in response to a second current supplied to a second LED configured to receive the second current; and
- generate a material modification plan based at least in part on the first color of light and the second color of light that includes a modification of the first amount of the first wavelength converting material, wherein the LED based illumination device, modified in accordance with the material modification plan, emits a third color of light in response to the first current within a predetermined tolerance of a first target color point.

17. The non-transitory, computer-readable medium of claim 16, wherein light emitted from the second LED illuminates at least a second amount of a second wavelength converting material, and wherein the material modification plan includes a modification of the second amount of the second wavelength converting material, wherein the LED based illumination device, modified in accordance with the material modification plan, emits a fourth color of light in response to the second current within a predetermined tolerance of a second target color point.

18. The non-transitory, computer-readable medium of claim 16, wherein the material modification plan includes a location of the modification of the first amount of the first wavelength converting material.

19. The non-transitory, computer-readable medium of claim 18, wherein the determining of the location of the first amount of the first wavelength converting material is based at least in part on any of an output beam intensity distribution of the LED based illumination device, a color conversion efficiency of the LED based illumination device, and a temperature distribution over a light emitting surface of the LED based illumination device.

20. The non-transitory, computer-readable medium of claim 16, wherein the modification of the first amount of the first wavelength converting material includes either adding or removing a portion of the first wavelength converting material.

* * * * *